US012733173B2

(12) United States Patent
Kim et al.

(10) Patent No.: US 12,733,173 B2
(45) Date of Patent: Sep. 8, 2026

(54) THREE-DIMENSIONAL MEMORY DEVICE

(71) Applicant: SAMSUNG ELECTRONICS CO., LTD., Suwon-si (KR)

(72) Inventors: Seungyeon Kim, Suwon-si (KR); In Ho Kang, Suwon-si (KR); Sukkang Sung, Suwon-si (KR); Beakhyung Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 18/897,719

(22) Filed: Sep. 26, 2024

(65) Prior Publication Data

US 2025/0142829 A1 May 1, 2025

(30) Foreign Application Priority Data

Oct. 31, 2023 (KR) ........................ 10-2023-0148250

(51) Int. Cl.

| | |
|---|---|
| ***G11C 16/24*** | (2006.01) |
| ***G11C 5/06*** | (2006.01) |
| ***G11C 16/04*** | (2006.01) |
| ***G11C 16/10*** | (2006.01) |
| ***G11C 16/26*** | (2006.01) |
| ***H10B 41/27*** | (2023.01) |
| ***H10B 41/41*** | (2023.01) |

(Continued)

(52) U.S. Cl.

CPC ............. *H10B 43/40* (2023.02); *G11C 5/063* (2013.01); *G11C 16/0483* (2013.01); *G11C 16/10* (2013.01); *G11C 16/26* (2013.01); *H10B 41/27* (2023.02); *H10B 41/41* (2023.02); *H10B 43/27* (2023.02); *H10B 80/00* (2023.02); *H10W 90/00* (2026.01)

(58) Field of Classification Search

CPC ..................................................... G11C 16/24

See application file for complete search history.

(56) References Cited

U.S. PATENT DOCUMENTS 11,380,702 B2 7/2022 Kim et al.
11,398,443 B2 7/2022 Oh et al.

(Continued)

FOREIGN PATENT DOCUMENTS

KR 10-2022-0005200 A 1/2022

OTHER PUBLICATIONS

Communication dated Mar. 6, 2025, issued by the European Patent Office in European Application No. 24208673.4.

*Primary Examiner* — Jason Lappas

(74) *Attorney, Agent, or Firm* — Sughrue Mion, PLLC

(57) ABSTRACT

A memory device is provided. The memory device includes: a memory cell array implemented in a first chip; and a peripheral circuit implemented in a second chip and a third chip which overlaps the first chip along a vertical direction. The peripheral circuit includes: a first peripheral circuit implemented in the second chip and the third chip; a second peripheral circuit implemented in the second chip and including at least one high-voltage transistor; and a third peripheral circuit implemented in the third chip and including at least one low-voltage transistor. The first peripheral circuit includes: a first sub-peripheral circuit implemented in the second chip and including at least one high-voltage transistor; and a second sub-peripheral circuit implemented in the third chip and including at least one low-voltage transistor.

20 Claims, 21 Drawing Sheets

(51) Int. Cl.

| | |
|---|---|
| ***H10B 43/27*** | (2023.01) |
| ***H10B 43/40*** | (2023.01) |
| ***H10B 80/00*** | (2023.01) |
| ***H10W 90/00*** | (2026.01) |

(56) References Cited

U.S. PATENT DOCUMENTS

| | | | | |
|---|---|---|---|---|
| 2021/0210460 | A1 | 7/2021 | He | |
| 2022/0005820 | A1 | 1/2022 | Kim et al. | |
| 2022/0122932 | A1 | 4/2022 | Oh et al. | |
| 2022/0293619 | A1 | 9/2022 | Kim et al. | |
| 2023/0005541 | A1 | 1/2023 | Yang et al. | |
| 2023/0005943 | A1 | 1/2023 | Zhang et al. | |
| 2023/0068995 | A1 | 3/2023 | Yang et al. | |
| 2023/0171964 | A1 | 6/2023 | Kim et al. | |
| 2023/0187396 | A1 | 6/2023 | Oh et al. | |
| 2023/0189519 | A1 | 6/2023 | Kim et al. | |
| 2024/0105267 | A1* | 3/2024 | Kang | G11C 16/24 |

* cited by examiner

FIG. 2

100F
Chip 1a (CELL2)
Chip 1b (CELL1)
Chip 2 (PERI2)
Chip 3 (PERI1)
BLBA
WLBA
PA
THV1
THV2
B1
B2
C1
C2
C3
D1
D2
D3
A1
A2
CH
LCH
UCH

THREE-DIMENSIONAL MEMORY DEVICE

CROSS-REFERENCE TO RELATED APPLICATION

This application claims priority to Korean Patent Application No. 10-2023-0148250, filed on Oct. 31, 2023, in the Korean Intellectual Property Office, the disclosure of which is incorporated by reference herein in its entirety.

BACKGROUND

The present disclosure relates to a semiconductor device, and more particularly to a three-dimensional memory device.

Memory devices are used to store data and may be classified into volatile memory devices and nonvolatile memory devices. As an example of the nonvolatile memory device, a flash memory device may be used in a mobile phone, a digital camera, a mobile computing device, a fixed computing device, and other devices. As information communication devices are developed to have an increasing number of functions, there is a need for memories with a large capacity and a high degree of integration. Accordingly, a three-dimensional (3D) nonvolatile memory device that includes a plurality of word lines stacked on a substrate along a vertical direction is being suggested.

As the number of layers of word lines stacked on the substrate in the 3D nonvolatile memory device increases, a cell area required to provide the same capacity is rapidly reduced. However, compared to the reduction in the cell area, an area required to implement a peripheral circuit decreases at a slower rate. This acts as a limiting factor in reducing a chip size of memory devices.

SUMMARY

Embodiments of the present disclosure provide a memory device capable of reducing an area occupied by a peripheral circuit.

Embodiments of the present disclosure provide a memory device capable of ensuring performance of circuit elements of the peripheral circuit implemented by high-voltage transistors.

According to an aspect of an example embodiment, a memory device includes: a memory cell array implemented in a first chip; and a peripheral circuit implemented in a second chip and a third chip which overlaps the first chip along a vertical direction. The peripheral circuit includes: a first peripheral circuit implemented in the second chip and the third chip; a second peripheral circuit implemented in the second chip and including at least one high-voltage transistor; and a third peripheral circuit implemented in the third chip and including at least one low-voltage transistor. The first peripheral circuit includes: a first sub-peripheral circuit implemented in the second chip and including at least one high-voltage transistor; and a second sub-peripheral circuit implemented in the third chip and including at least one low-voltage transistor.

According to an aspect of an example embodiment, a memory device includes: a first chip including a memory cell array; a second chip bonded to the first chip and including at least one high-voltage transistor; and a third chip bonded to the second chip and including at least one low-voltage transistor. The at least one high-voltage transistor provided in the second chip overlaps the at least one low-voltage transistor provided in the third chip along a vertical direction.

According to an aspect of an example embodiment, a memory device includes: a first chip including a memory cell array; a second chip including a plurality of high-voltage transistors and overlapping the first chip along a vertical direction; and a third chip including a plurality of low-voltage transistors and overlapping the second chip along the vertical direction. The second chip includes: a plurality of pass transistors connected to word lines of the memory cell array; and a plurality of high-voltage page buffers connected to bit lines of the memory cell array. The third chip includes: a voltage generator configured to generate a voltage provided to the plurality of pass transistors; and a plurality of low-voltage page buffers corresponding to the plurality of high-voltage page buffers, respectively, and including a plurality of latches.

The peripheral circuits may be implemented by at least two chips different from each other, and the at least two chips different from each other may be bonded to each other along a vertical direction. Thus, an area occupied by the peripheral circuit when viewed in a plane may be reduced.

High-voltage transistors may be implemented to have a sufficient width or length.

BRIEF DESCRIPTION OF DRAWINGS

The above and other aspects and features of the present disclosure will be more clearly understood from the following description of example embodiments, taken in conjunction with the accompanying drawings, in which:

FIG. 2 is a view illustrating a memory block among memory blocks included in a memory cell array of FIG. 1 and a peripheral circuit corresponding to the memory block;

DETAILED DESCRIPTION

Below, example embodiments will be described with reference to the accompanying drawings. Embodiments described herein are example embodiments, and thus, the present disclosure is not limited thereto, and may be realized in various other forms. Each example embodiment provided in the following description is not excluded from being associated with one or more features of another example or another embodiment also provided herein or not provided herein but consistent with the present disclosure. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
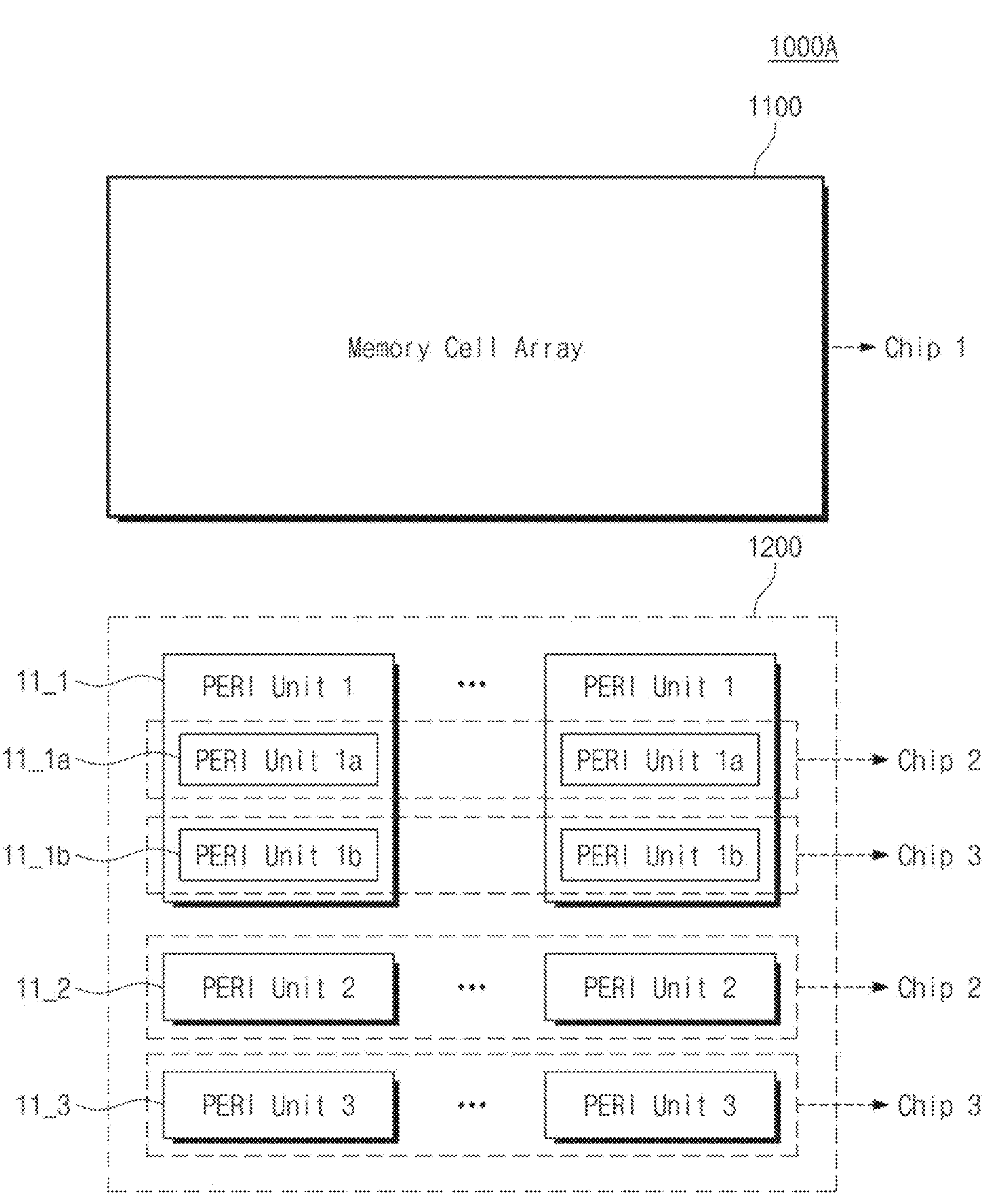
FIG. 1 is a block diagram illustrating a memory device according to an example embodiment.

FIG. 1 is a block diagram illustrating a memory device 1000A according to an example embodiment.

The memory device 1000A may have a chip-to-chip (C2C) structure. The C2C structure may refer to a structure which is formed by manufacturing at least one chip including memory cells, manufacturing at least one chip including a peripheral circuit, and connecting the chips to each other in a bonding process. In particular, the peripheral circuit of the memory device 1000A may be implemented by at least two chips, and the at least two chips may be vertically connected to each other by the bonding process. Accordingly, a planar area occupied by the peripheral circuit may be reduced.

In addition, among a plurality of circuit elements constituting the peripheral circuit of the memory device 1000A, high-voltage transistors may be arranged in the same chip. Because the number of the high-voltage transistors is relatively smaller than the number of other circuit elements, the high-voltage transistors may be arranged with sufficient width or length, and consequently, a performance of the high-voltage transistors may be ensured.

Referring to FIG. 1, the memory device 1000A may include a memory cell array 1100 and a peripheral circuit 1200.

The memory cell array 1100 may include a plurality of memory cells. As an example, the memory cell array 1100 may include a plurality of flash memory cells, however, example embodiments are not limited thereto or thereby. According to an example embodiment, the memory cells may be resistive memory cells such as a resistive RAM (ReRAM), a phase change RAM (PRAM) or a magnetic RAM (MRAM).

The memory cell array 1100 may include a plurality of memory blocks. Each memory block may have a two-dimensional structure or a three-dimensional structure. In the memory block having the two-dimensional structure (or a horizontal structure), the memory cells may be formed in a horizontal direction with respect to a substrate. In the memory block having the three-dimensional structure (or a vertical structure), the memory cells may be formed in a vertical direction with respect to a substrate. Each memory cell may store multi-bit data therein.

The memory cell array 1100 may be disposed on a first wafer. The first wafer on which the memory cell array 1100 is disposed may be referred to as a first chip Chip 1.

The peripheral circuit 1200 may be disposed adjacent to the memory cell array 1100. As an example, the peripheral circuit 1200 may be disposed in the vertical direction with respect to the memory cell array 1100 to overlap the memory cell array 11001100 when viewed in a plan view. The peripheral circuit 1200 may include a plurality of peripheral circuit units PERI Unit 1, PERI Unit 2, and PERI Unit 3.

A first peripheral circuit unit 111 may be a circuit element that includes at least one high-voltage transistor and at least one low-voltage transistor. As an example, the first peripheral circuit unit 111 may include a first sub-peripheral circuit unit 11_1*a* and a second sub-peripheral circuit unit 11_1*b*, the first sub-peripheral circuit unit 11_1*a* may include at least one high-voltage transistor, and the second sub-peripheral circuit unit 11_1*b* may include at least one low-voltage transistor.

A second peripheral circuit unit 11_2 may be a circuit element that includes at least one high-voltage transistor.

A third peripheral circuit unit 11_3 may be a circuit element that includes at least one low-voltage transistor.

According to an example embodiment, the peripheral circuit 1200 may be implemented by a second wafer and a third wafer. The second wafer on which some of the circuit elements of the peripheral circuit 1200 are disposed may be referred to as a second chip Chip 2, and the third wafer on which the other of the circuit elements of the peripheral circuit 1200 are disposed may be referred to as a third chip Chip 3. The second chip Chip 2 and the third chip Chip 3 may be connected to each other in the vertical direction by a bonding process. As described above, because the peripheral circuit 1200 is manufactured to have the C2C structure, a planar area occupied by the peripheral circuit 1200 may be reduced.

In addition, according to an example embodiment, the high-voltage transistors among the circuit elements of the peripheral circuit 1200 may be intensively disposed in the same chip. As an example, the first sub-peripheral circuit unit 11_1*a* configured to include the high-voltage transistor in the first peripheral circuit unit 11_1, and the second peripheral circuit unit 11_2 configured to include the high-voltage transistor may be disposed in the second chip Chip 2. The third peripheral circuit unit 11_3 configured to include the low-voltage transistor may be disposed in the third chip Chip 3.

Among the circuit elements constituting the peripheral circuit 1200, the number of the high-voltage transistors may be smaller than the number of other circuit elements. Accordingly, when the high-voltage transistors among the circuit elements constituting the peripheral circuit 1200 are intensively disposed in the second chip Chip 2, the high-voltage transistors may have sufficient width or length. Accordingly, a degradation in performance that occurs when implementing a small high-voltage transistor and an increase in costs due to additional processes may be prevented.

As described above, the peripheral circuit 1200 may be implemented by the at least two chips, and thus, the area occupied by the peripheral circuit 1200 may be reduced. In addition, because the high-voltage transistors among the circuit elements of the peripheral circuit 1200 may be intensively disposed in the same chip, the high-voltage transistors may be implemented with sufficient width or length, and as a result, the performance of the high-voltage transistor may be improved.

Figure 2:
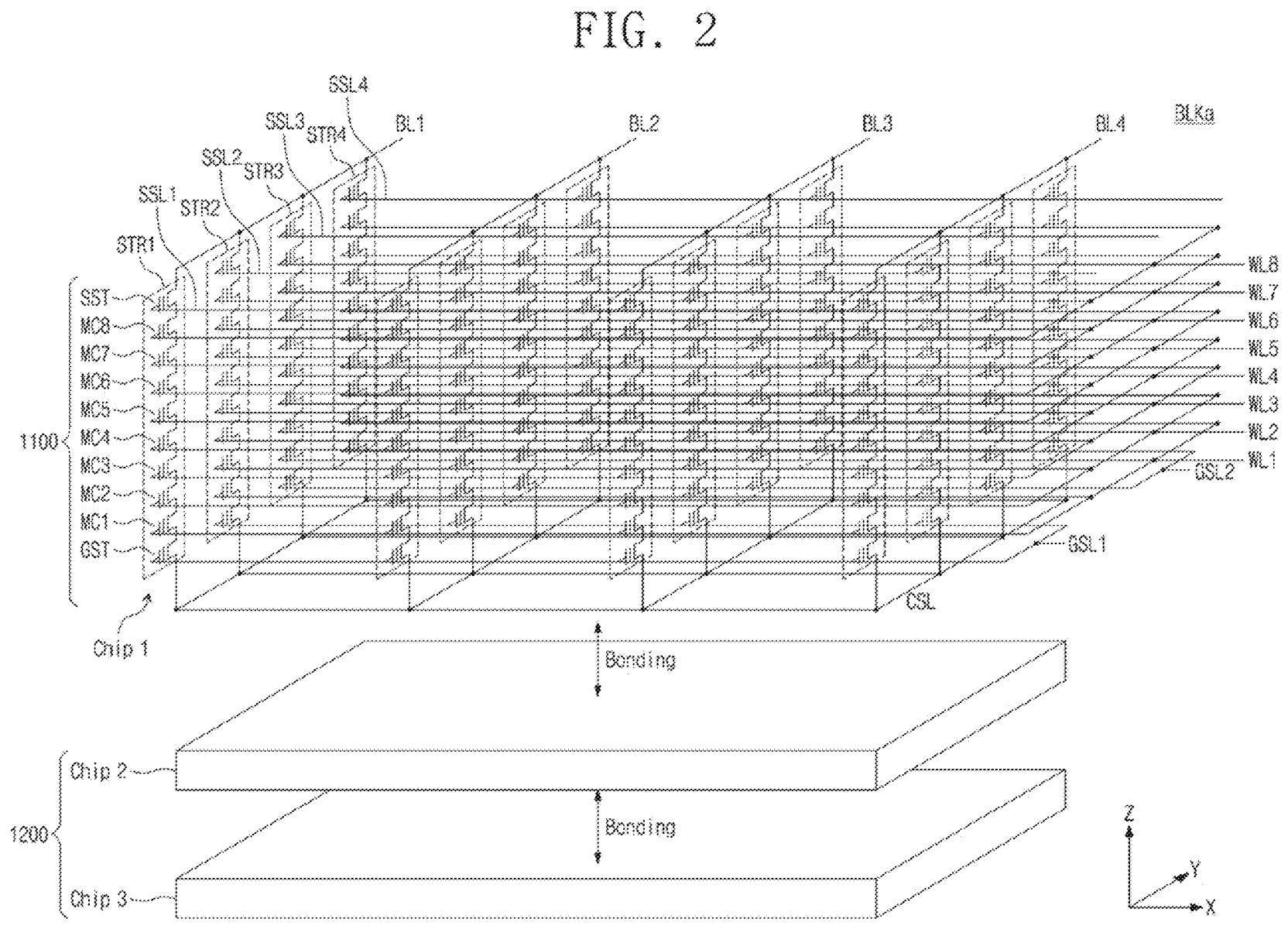

FIG. 2 is a view illustrating one memory block BLKa among the memory blocks included in the memory cell array 1100 of FIG. 1 and the peripheral circuit corresponding to the memory block BLKa.

Referring to FIG. 2, the memory block BLKa may include a plurality of strings STR arranged in rows and columns. The strings STR may be commonly connected to a common source line CSL. FIG. 2 shows a structure in which the common source line CSL is connected to lower ends of the strings STR. However, the common source line CSL is not limited to being physically located at the lower ends of the strings STR as long as the common source line CSL is electrically connected to the lower ends of the strings STR. As an example, FIG. 2 shows a structure in which the strings STR are arranged in four rows by four columns (4×4), however, the memory block BLKa may include fewer or more strings.

The strings of each row may be commonly connected to a ground selection line GSL1 or GSL2. As an example, the strings of first and second rows may be commonly connected to a first ground selection line GSL1, and the strings of third and fourth rows may be commonly connected to a second ground selection line GSL2, however, this is an example. According to an example embodiment, four different ground selection lines may be provided, and the strings of each row may be implemented to be connected to different ground selection lines from each other.

The strings of each row may be connected to a corresponding string selection lines among first to fourth string selection lines SSL1 to SSL4, strings of each column may be connected to a corresponding bit line among first to fourth bit lines BL1 to BL4.

Each string may include at least one ground selection transistor GST connected to the ground selection line GSL1 or GSL2, a plurality of memory cells MC1 to MC8 respectively connected to a plurality of word lines WL1 to WL8, and string selection transistors SST respectively connected to the string selection lines SSL1, SSL2, SSL3, and SSL4.

In each string, the ground selection transistor GST, the memory cells MC1 to MC8, and the string selection transistors SST may be connected to each other in series along a direction vertical to the peripheral circuit 1200 and may be sequentially stacked in the direction vertical to the peripheral circuit 1200. In each string STR, at least one of the memory cells MC1 to MC8 may be used as a dummy memory cell. The dummy memory cell may not be programmed (e.g. program inhibited) or may be programmed differently from remaining memory cells among the memory cells MC1 to MC8.

The memory cell array 1100 may be disposed in the first chip Chip 1, the peripheral circuit 1200 may be disposed in the second chip Chip 2 and the third chip Chip 3, and the first to third chips Chip 1 to Chip 3 may be connected to each other by the bonding process. As an example, the bonding process may indicate a process that electrically or physically connects a bonding metal pattern formed at a top metal layer of one chip to a bonding metal pattern formed at a top metal layer of another chip. As an example, when the bonding metal patterns include copper (Cu), the bonding process may be a Cu-to-Cu bonding process. According to an example embodiment, the bonding metal patterns may include aluminum (Al) or tungsten (W).

The second chip Chip 2 may be disposed under the first chip Chip 1, and the third chip Chip 3 may be disposed under the second chip Chip 2. That is, along the vertical direction, the first chip Chip 1, the second chip Chip 2, and the third chip Chip 3 may overlap each other. Therefore, the planar area occupied by the peripheral circuit 1200 may be reduced.

Figure 3A:
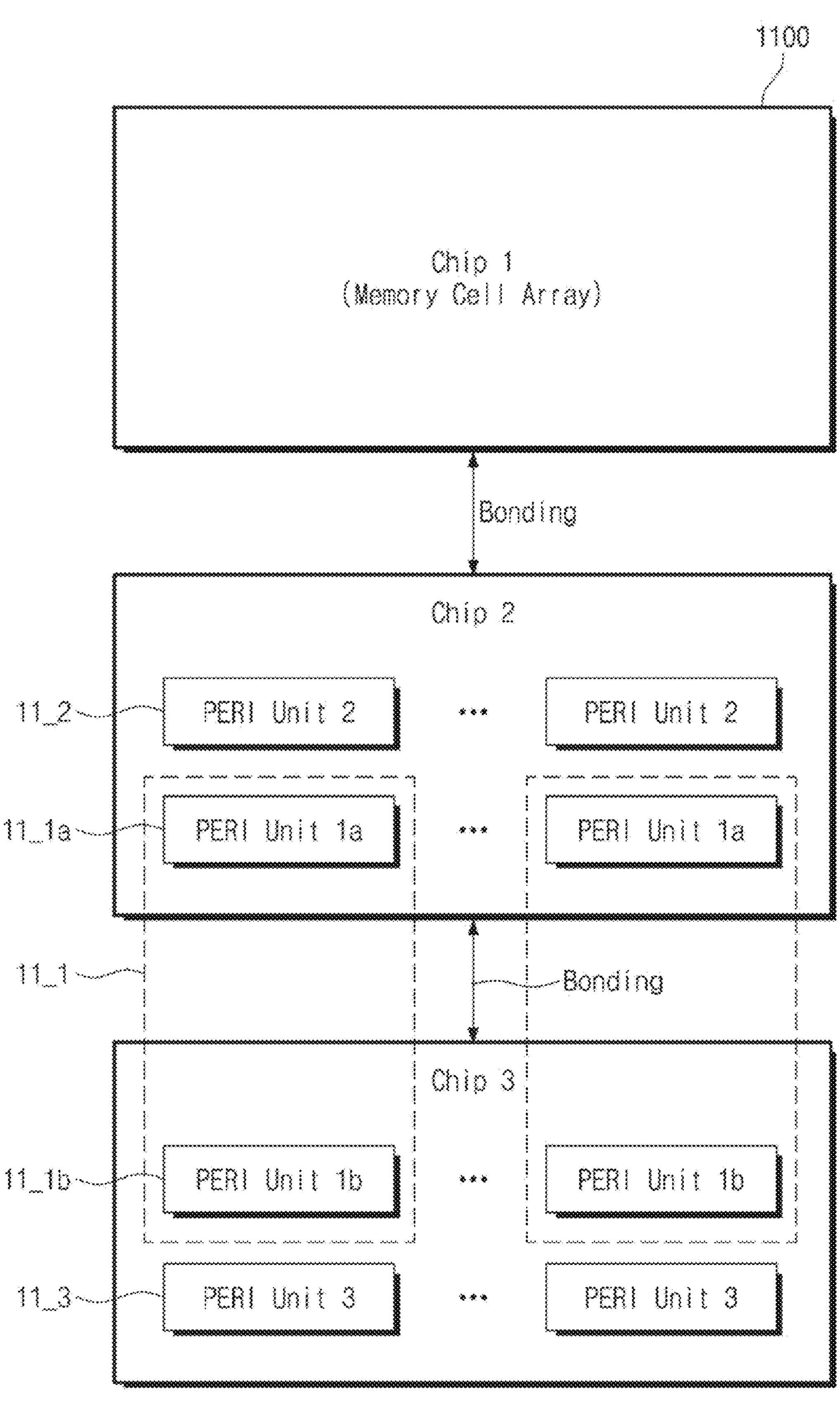
FIGS. 3A and 3B are block diagrams illustrating circuit elements of peripheral circuits of memory devices, which are arranged in different chips, according to example embodiments.
Figure 3B:
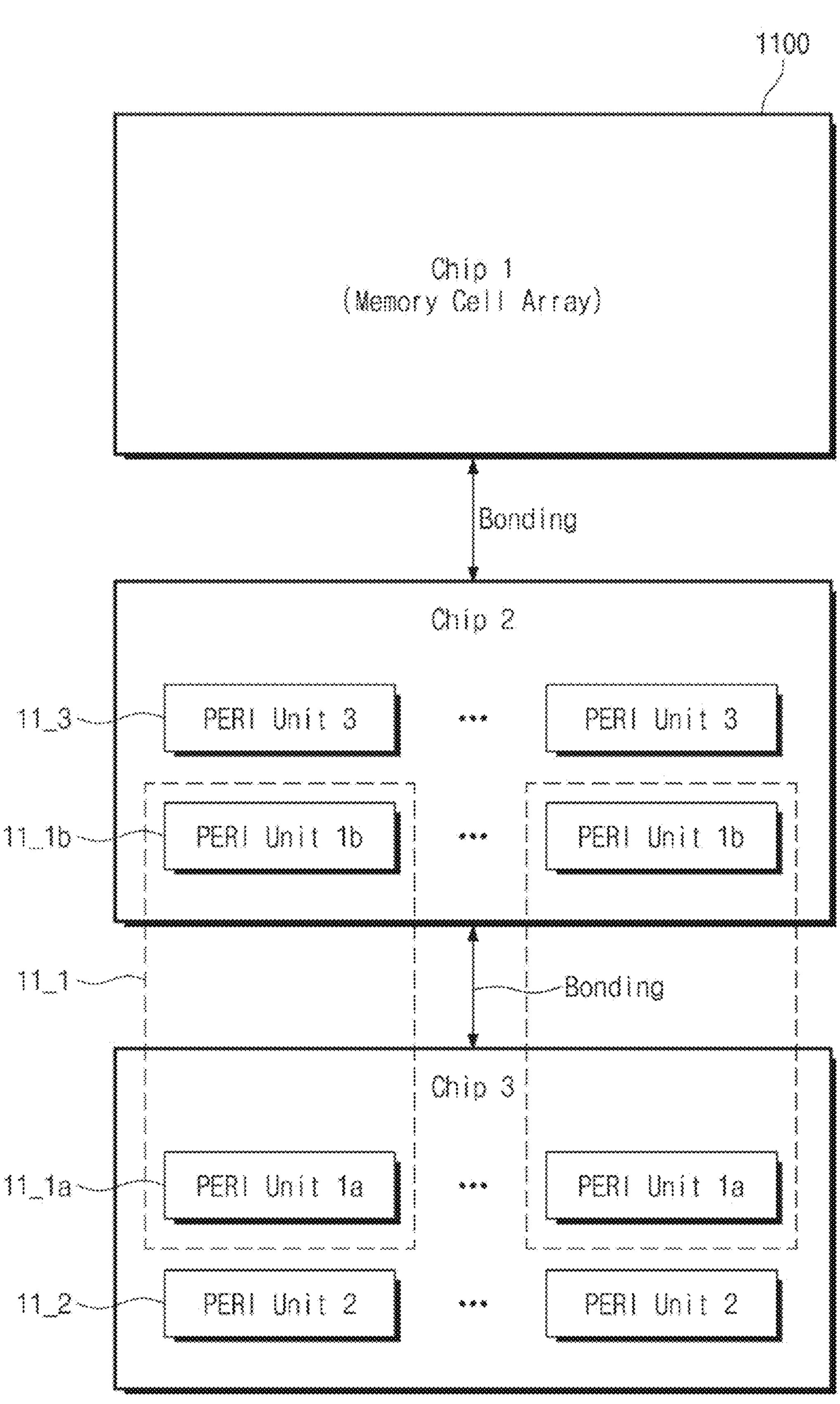

FIGS. 3A and 3B are block diagrams illustrating circuit elements of peripheral circuits of memory devices, which are arranged in different chips, according to example embodiments. The memory device of FIGS. 3A and 3B may correspond to the memory device 1000A of FIG. 1. Accordingly, in FIGS. 3A and 3B, the same or similar reference numerals denote the same or similar elements in FIG. 1, and thus, repeated descriptions of the same or similar elements will be omitted.

Referring to FIG. 3A, circuit elements of a peripheral circuit 1200 may be disposed in a second chip Chip 2 and a third chip Chip 3, and the second chip Chip 2 and the third chip Chip 3 may be connected to each other by a bonding process.

Among the circuit elements of the peripheral circuit 1200, high-voltage transistors may be disposed in the second chip Chip 2. As an example, a second peripheral circuit unit 11_2 including a high-voltage transistor may be disposed in the second chip Chip 2. In addition, a first sub-peripheral circuit unit 11_1*a* including a high-voltage transistor of a first peripheral circuit unit 11_1 may be disposed in the second chip Chip 2.

Among the circuit elements of the peripheral circuit 1200, circuit elements other than the high-voltage transistors may be disposed in the third chip Chip 3. As an example, a third peripheral circuit unit 11_3 including a low-voltage transistor may be disposed in the third chip Chip 3. In addition, a second sub-peripheral circuit unit 11_1*b* including a low-voltage transistor of the first peripheral circuit unit 111 may be disposed in the third chip Chip 3.

According to an example embodiment, the circuit elements of the peripheral circuit 1200, which are respectively disposed in the second chip Chip 2 and the third chip Chip 3, may be distinguished from each other based on their operations.

As an example, transistors, e.g., a pass transistor, that select row lines, such as a word line WL, a string selection line SSL, a ground selection line GSL, etc., or provide a high voltage to the row lines, may be disposed in the second chip Chip 2. According to an example embodiment, transistors, e.g., a bit line selection transistor of a page buffer, that select column lines such as a bit line BL or provide a high voltage to the column lines may be disposed in the second chip Chip 2.

As an example, circuit elements, e.g., an input/output circuit, that receive data from an outside and provide the received data to the page buffer may be disposed in the third chip Chip 3. According to an example embodiment, circuit elements, e.g., a latch of the page buffer, that temporarily store data corresponding to each bit line BL may be disposed in the third chip Chip 3.

These will be described in detail later with reference to FIGS. 4 to 8.

According to an example embodiment, the circuit elements of the peripheral circuit 1200, which are respectively disposed in the second chip Chip 2 and the third chip Chip 3, may be distinguished from each other based on their structures.

As an example, transistors with a relatively thick gate insulating layer may be disposed in the second chip Chip 2, and transistors with a relatively thin gate insulating layer may be disposed in the third chip Chip 3. This will be described in detail later with reference to FIGS. 10 and 11.

According to an example embodiment, the circuit elements of the peripheral circuit 1200, which are respectively disposed in the second chip Chip 2 and the third chip Chip 3, may be distinguished from each other based on a structure of an element isolation area.

As an example, the circuit elements disposed in the second chip Chip 2 may be defined by an element isolation area that is relatively deeply formed, and the circuit elements disposed in the third chip Chip 3 may be defined by a relatively shallow element isolation area. This will be described in detail later with reference to FIGS. 13 and 14.

FIGS. 1 and 3A show the structures in which the high-voltage transistors among the circuit elements of the peripheral circuit 1200 are disposed in the second chip Chip 2 and the circuit elements other than the high-voltage transistors among the circuit elements of the peripheral circuit 1200 are disposed in the third chip Chip 3. However, these are examples, and example embodiments are not limited thereto or thereby.

As an example, referring to FIG. 3B, a third peripheral circuit unit 11_3 and a second sub-peripheral circuit unit 11_1$b$, which include low-voltage transistors among circuit elements of the peripheral circuit 1200, may be disposed in the second chip Chip 2, and a second peripheral circuit unit 11_2 and a first sub-peripheral circuit unit 11_1$a$, which include high-voltage transistors among the circuit elements of the peripheral circuit 1200, may be disposed in the third chip Chip 3.

According to an example embodiment, the high-voltage transistors and some of the low-voltage transistors among the circuit elements of the peripheral circuit 1200 may be disposed in the second chip Chip 2, and the other low-voltage transistors among the circuit elements of the peripheral circuit 1200 may be disposed in the third chip Chip 3.

According to an example embodiment, some of the high-voltage transistors among the circuit elements of the peripheral circuit 1200 may be disposed in the second chip Chip 2, and the low-voltage transistors and the other of the high-voltage transistors among the circuit elements of the peripheral circuit 1200 may be disposed in the third chip Chip 3.

As described above, the peripheral circuit of the memory device may be implemented by connecting the at least two chips to each other through the bonding process. Accordingly, the planar area occupied by the peripheral circuit may be reduced. In addition, the relatively small number of high-voltage transistors may be intensively disposed in the same chip according to example embodiments. Therefore, the high-voltage transistors may have sufficient width or length, and the performance of the high-voltage transistor may be ensured.

Hereinafter, configurations and structures of the memory device according to example embodiments will be described in more detail. In addition, for the convenience of explanation, it is assumed that the high-voltage transistors among the circuit elements of the peripheral circuit are disposed in the second chip Chip 2 and the circuit elements other than the high-voltage transistors among the circuit elements of the peripheral circuit are disposed in the third chip Chip 3.

In addition, for the convenience of explanation, it is assumed that the page buffer includes both the high-voltage transistor and the low-voltage transistor. It is assumed that the pass transistor includes the high-voltage transistor. Further, it is assumed that circuit elements, e.g., a voltage generator, that generate voltages required by the memory device, circuit elements, e.g., the input/output circuit, that receive the data from the outside and provide the received data to the page buffer, and circuit elements, e.g., a control logic, that control an overall operation of the memory device are implemented by the low-voltage transistor, however, this is an example. According to an example embodiment, similar to the page buffer, the voltage generator, the input/output circuit, and the control logic may be implemented to include both the high-voltage transistor and the low-voltage transistor.

Figure 4:
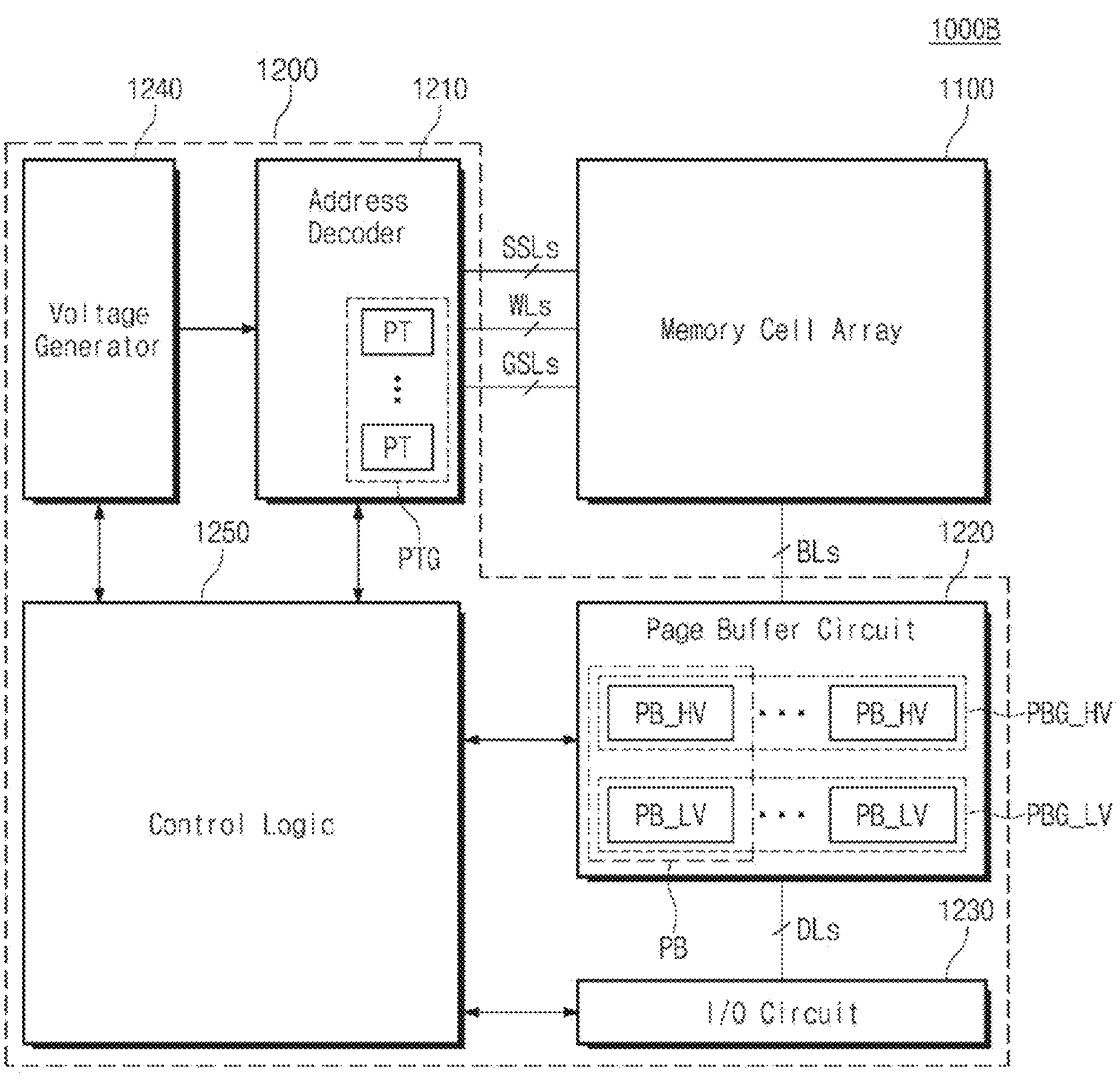
FIG. 4 is a block diagram illustrating a memory device according to an example embodiment.

FIG. 4 is a block diagram illustrating a memory device 1000B according to an example embodiment.

Referring to FIG. 4, the memory device 1000B may include a memory cell array 1100 and a peripheral circuit 1200.

The memory cell array 1100 may be connected to a page buffer circuit 1220 through bit lines BL and may be connected to an address decoder 1210 through word lines WL, string selection lines SSL, and ground selection lines GSL. The memory cell array 1100 may include a plurality of memory cells.

The peripheral circuit 1200 may be disposed adjacent to the memory cell array 1100. As an example, the peripheral circuit 1200 may be disposed in a vertical direction with respect to the memory cell array 1100 to overlap the memory cell array 1100 when viewed along the vertical direction. The peripheral circuit 1200 may include the address decoder 1210, the page buffer circuit 1220, an input/output circuit 1230, a voltage generator 1240, and a control logic 1250.

The address decoder 1210 may be connected to the memory cell array 1100 through row lines. The row lines may include selection lines, such as the string selection lines SSL and the ground selection lines GSL, and the word lines WLs. Responsive to a control by the control logic 1250, the address decoder 1210 may select one of a plurality of memory blocks, may select one of the word lines WL of the selected memory block, and may select one of the string selection lines SSL.

The address decoder 1210 may include a plurality of pass transistors PTs. One end of each of the pass transistors PTs may be connected to a corresponding row line among the row lines. Each of the pass transistors PTs may receive a voltage from the voltage generator 1240 and may provide the received voltage to the corresponding row line.

The pass transistors PTs may be implemented by the high-voltage transistor and may be disposed in a second chip Chip 2. The pass transistors PTs may be referred to as a pass transistor group PTG.

The page buffer circuit 1220 may be connected to the memory cell array 1100 through column lines. The column lines may include, for example, the bit line BL. The page buffer circuit 1220 may temporarily store data to be programmed in a selected page or data read out from the selected page.

The page buffer circuit 1220 may include a plurality of page buffers PBs. Each of the page buffers PBs may include a high-voltage page buffer PB_HV and a low-voltage page buffer PB_LV. The high-voltage page buffer PB_HV may select the bit line BL, and the low-voltage page buffer PB_LV may temporarily store data.

Among the page buffer PB, the high-voltage page buffer PB_HV may include the high-voltage transistor and may be disposed in the second chip Chip 2. Among the page buffer PB, the low-voltage page buffer PB_LV may include a plurality of low-voltage transistors and latches and may be disposed in a third chip Chip 3. A plurality of high-voltage page buffers PB_HVs may be referred to as a high-voltage page buffer group PBG_HV, and a plurality of low-voltage page buffers PB_LVs may be referred to as a low-voltage page buffer group PBG_LV.

The input/output circuit 1230 may be connected to the page buffer circuit 1220 through data lines DLs and may be connected to an external source through an input/output line. The input/output circuit 1230 may receive data from the external source to be programmed in the selected memory cell of the memory cell array 1100 during a program operation and may transmit data read-out from the selected memory cell to the outside during a read-out operation.

The input/output circuit 1230 may include low-voltage transistors and may be disposed in the third chip Chip 3.

The voltage generator 1240 may receive an internal voltage from the control logic 1250 and may generate a row line voltage required to read out or write data. The row line voltage may be applied to the string selection line SSL, the word line WL, and/or the ground selection line GSL through the address decoder 1210.

The voltage generator 1240 may include a charge pump and/or low-voltage transistors and may be disposed in the third chip Chip 3.

The control logic 1250 may control an overall operation of the memory device 1000B. The control logic 1250 may include low-voltage transistors and may be disposed in the third chip Chip 3.

As described above, the circuit elements of the peripheral circuit 1200 may be disposed in either the second chip Chip 2 or the third chip Chip 3 depending on the operations supported thereby. In particular, among the circuit elements of the peripheral circuit 1200, the high-voltage transistors may be intensively disposed in the second chip Chip 2.

Figure 5:
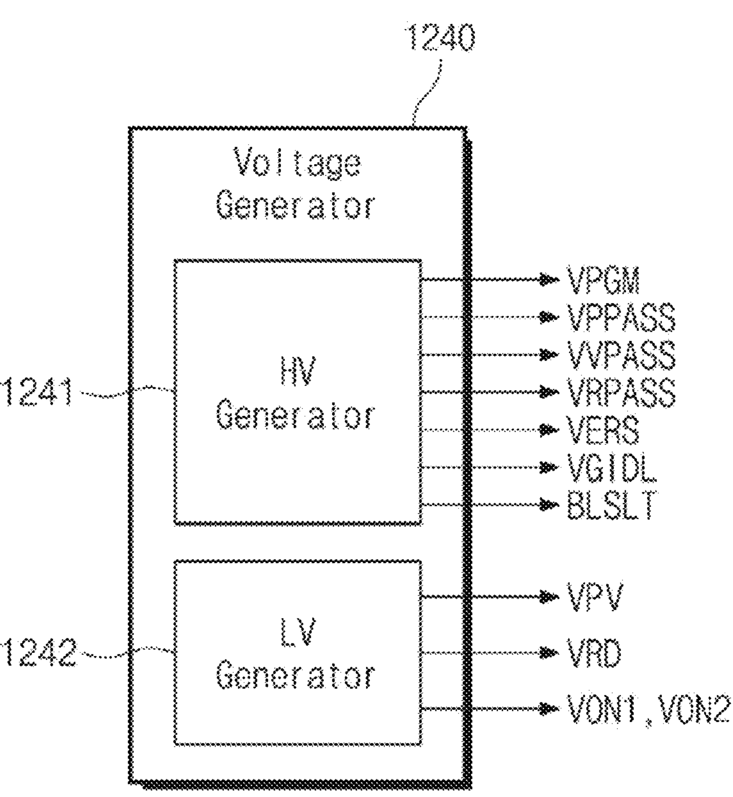
FIG. 5 is a block diagram illustrating a voltage generator according to an example embodiment.

FIG. 5 is a block diagram illustrating the voltage generator 1240 of FIG. 4.

Referring to FIG. 5, the voltage generator 1240 may include a high-voltage generator 1241 and a low-voltage generator 1242.

The high-voltage generator 1241 may generate a program voltage VPGM, a program pass voltage VPPASS, a verification pass voltage VVPASS, a read pass voltage VRPASS, and an erase voltage VERS in response to a control by the control logic 1250 according to an operation mode of the memory device 1000B. In addition, according to an example embodiment, when the memory device 1000B supports a GIDL erase operation, the high-voltage generator 1241 may further generate a GIDL voltage VGIDL. In addition, according to an example embodiment, responsive to a control by the control logic 1250, the high-voltage generator 1241 may generate a bit line selection signal BLSLT according to an operation mode of the memory device 1000B.

The program voltage VPGM may be applied to the word line that is selected, and the program pass voltage VPPASS, the verification pass voltage VVPASS, and the read pass voltage VRPASS may be applied to the word line that is not selected. In addition, when the memory device 1000B supports the GIDL erase operation, the GIDL voltage VGIDL may be applied to a GIDL line. Further, the bit line selection signal BLSLT may be applied to a gate of a bit line selection transistor corresponding to the selected bit line BL.

The low-voltage generator 1242 may generate a program verification voltage VPV, a read voltage VRD, an erase verification voltage VEV, a first turn-on voltage VON1, and a second turn-on voltage VON2 in response to a control by the control logic 1250 according to an operation mode of the memory device 1000B.

The program verification voltage VPV, the read voltage VRD, and the erase verification voltage VEV may be applied to the selected word line according to the operation mode. The first turn-on voltage VON1 and the second turn-on voltage VON2 may be applied to a string selection transistor and a ground selection transistor according to the operation mode.

However, this is an example, and the high-voltage generator 1241 may further generate various high voltages according to example embodiments.

Figure 6:
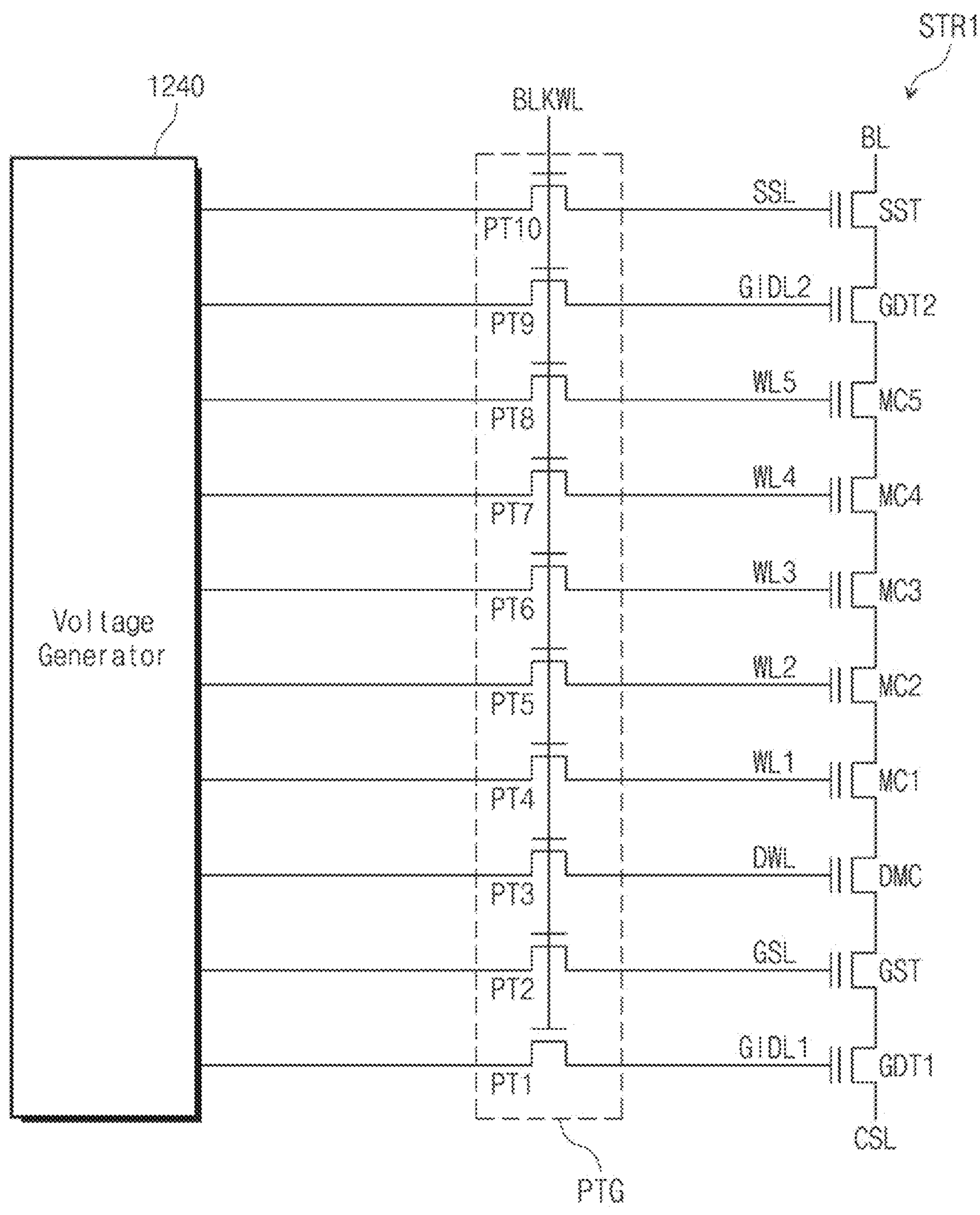
FIG. 6 is a circuit diagram illustrating a pass transistor group according to an example embodiment.

FIG. 6 is a circuit diagram illustrating the pass transistor group PTG of FIG. 4. For the convenience of explanation, it is assumed that the memory device 1000B supports the GIDL erase operation in FIG. 6. Accordingly, it is assumed that a string STR1 includes first and second GIDL transistors GDT1 and GDT2 and the first and second GIDL transistors GDT1 and GDT2 are disposed at lower and upper portions in the string STR1, respectively.

Referring to FIG. 6, the pass transistor group PTG may include a plurality of pass transistors PT1 to PT10. The pass transistor group PTG may be disposed between the voltage generator 1240 and the string STR1 and may provide the voltage generated by the voltage generator 1240 to row lines SSL, GSL, GIDL1, GIDL2, DWL, and WL1 to WL5 of the string STR1.

As an example, one end of a first pass transistor PT1 may be connected to the voltage generator 1240, and the other end of the first pass transistor PT1 may be connected to a first GIDL line GIDL1. During the GIDL erase operation, the first pass transistor PT1 may be turned on in response to a voltage level of a block word line BLKWL and may provide the GIDL voltage generated by the voltage generator 1240 to the first GIDL line GIDL1.

Similarly, one end of each of second to tenth pass transistors PT2 to PT10 may be connected to the voltage generator 1240, and the other end of each of the second to tenth pass transistors PT2 to PT10 may be connected to the row line of the string STR1. Each of the second to tenth pass transistors PT2 to PT10 may provide the voltage generated by the voltage generator 1240 according to an operation mode to a corresponding row line in response to the voltage level of the block word line BLKWL.

According to an operation mode, each of the pass transistors PT1 to PT10 may receive one of the program voltage VPGM, the program pass voltage VPPASS, the verification pass voltage VVPASS, the read pass voltage VRPASS, and the GIDL voltage VGIDL, which are generated by the high-voltage generator 1241, and may provide the received voltage to a corresponding row line. Accordingly, all the pass transistors PT1 to PT10 may be implemented by the high-voltage transistors and may be disposed in the second chip Chip 2.

However, this is an example, and some of the pass transistors PT1 to PT10 may be implemented by the low-voltage transistor according to example embodiments. In this case, the pass transistors implemented by the high-voltage transistor may be disposed in the second chip Chip 2, and the pass transistors implemented by the low-voltage transistor may be disposed in the third chip Chip 3. According to an example embodiment, both the pass transistors implemented by the high-voltage transistor and the pass transistors implemented by the low-voltage transistor may be disposed in the second chip Chip 2.

Figure 7:
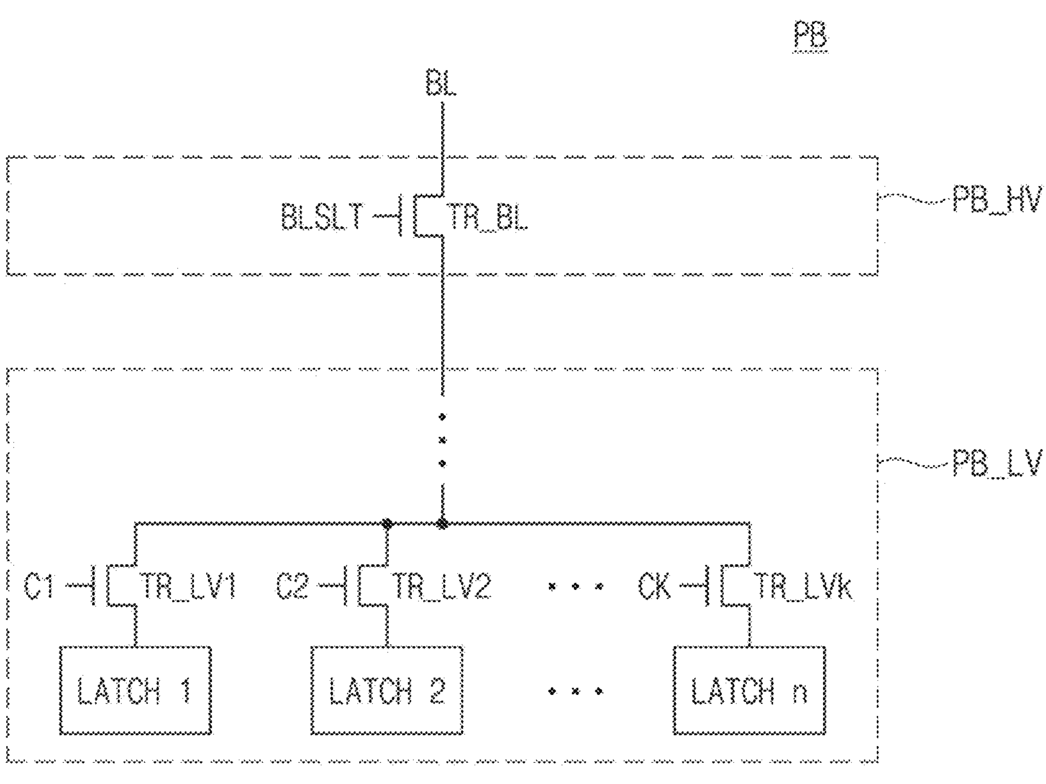
FIG. 7 is a circuit diagram illustrating a page buffer according to an example embodiment.

FIG. 7 is a circuit diagram illustrating the page buffer PB of FIG. 4.

Referring to FIG. 7, the page buffer PB may include the high-voltage page buffer PB_HV and the low-voltage page buffer PB_LV.

The high-voltage page buffer PB_HV may include a bit line selection transistor TR_BL. The bit line selection transistor TR_BL may be turned on in response to a bit line selection signal BLSLT and may connect the bit line BL to the low-voltage page buffer PB_LV. In this case, a voltage level of the bit line selection signal BLSLT may be a high voltage, and thus, the bit line selection transistor TR_BL may be implemented by the high-voltage transistor. The high-voltage page buffer PB_HV may be disposed in the second chip Chip 2.

The low-voltage page buffer PB_LV may include a plurality of transistors TR_LV1 to TR_LVk and a plurality of latches LATCH 1 to LATCH n. As an example, the low-voltage page buffer PB_LV may store sensing results for the data stored in the memory cell during the read operation or may store the data to be programmed during the program operation. In this case, the transistors TR_LV1 to TR_LVk may be turned on in response to control signals C1 to Ck at a low voltage level, respectively, and thus, the transistors TR_LV1 to TR_LVk may be implemented by the low-voltage transistor. The low-voltage page buffer PB_LV may be disposed in the third chip Chip 3.

The high-voltage page buffer PB_HV and the low-voltage page buffer LV may be disposed in the second chip Chip 2 and the third chip Chip 3, respectively, and the high-voltage page buffer PB_HV and the low-voltage page buffer PB_LV may at least partially overlap each other when viewed in a plan view. Accordingly, a metal line to connect the high-voltage page buffer PB_HV and the low-voltage page buffer PB_LV is not required, or if present does not need to be long. For example, the metal line may extend in the vertical direction between the second chip Chip 2 and the third chip Chip 3. Therefore, a deterioration in performance of the page buffer due to a parasitic resistance caused by a long metal line may be prevented.

Figure 8:
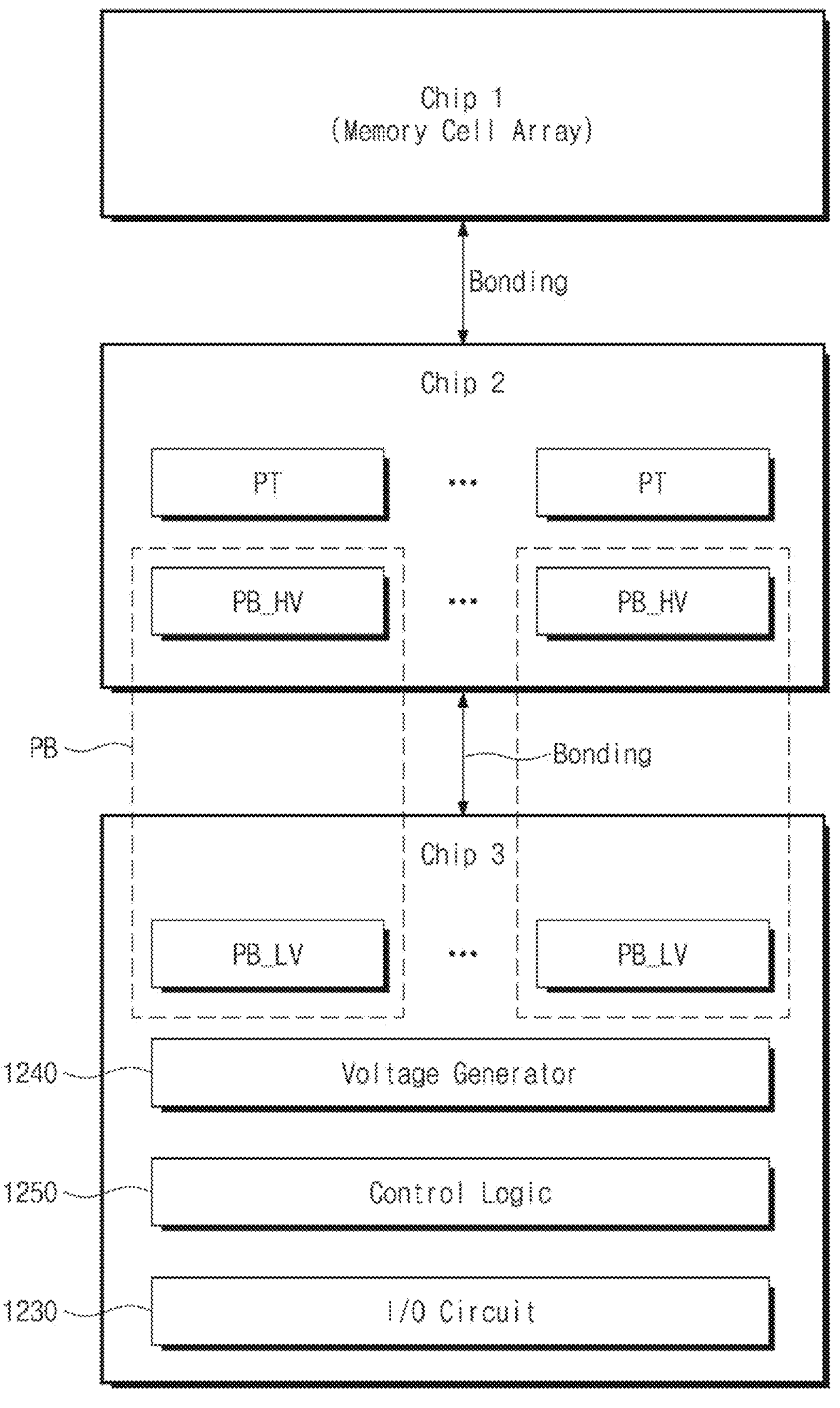
FIG. 8 is a block diagram illustrating memory devices disposed in first to third chips according to an example embodiment.

FIG. 8 is a block diagram illustrating the memory device 1000B of FIG. 4 disposed in the first to third chips.

Referring to FIG. 8, the first to third chips Chip 1 to Chip 3 may be connected to each other by the bonding process.

The memory cell array may be disposed in the first chip Chip 1.

The high-voltage transistors among the circuit elements of the peripheral circuit 1200 may be disposed in the second chip Chip 2. As an example, the pass transistors PTs and the high-voltage page buffers PB_HVs may be disposed in the second chip Chip 2.

The circuit elements other than the high-voltage transistors among the circuit elements of the peripheral circuit 1200 may be disposed in the third chip Chip 3. As an example, the low-voltage page buffers PB_LVs, the voltage generator 1240, the control logic 1250, and the input/output circuit 1230 may be disposed in the third chip Chip 3.

However, this is an example, and some of the circuit elements disposed in the third chip Chip 3 may be disposed in the second chip Chip 2 according to example embodiments.

As described with reference to FIGS. 4 to 8, the circuit elements constituting the peripheral circuit of the memory device according to example embodiments may be disposed in either the second chip Chip 2 or the third chip Chip 3 depending on the operation supported thereby. In particular, among the circuit elements constituting the peripheral circuit 1200, the high-voltage transistors may be intensively disposed in the same chip, for example the second chip Chip 2. Accordingly, the planar area occupied by the peripheral circuit may be reduced, and the performance of the high-voltage transistor may be ensured.

Figure 9A:
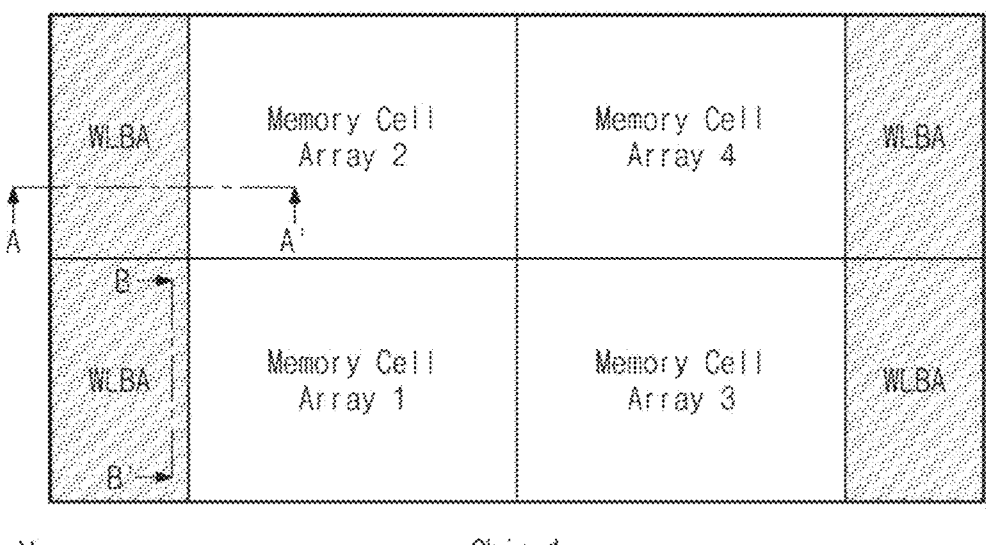
FIGS. 9A, 9B and 9C are views illustrating circuit elements of a memory device, which are arranged in different chips from each other according to an example embodiment.
Figure 9A:
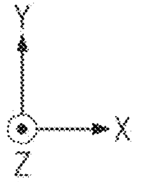
Figure 9B:
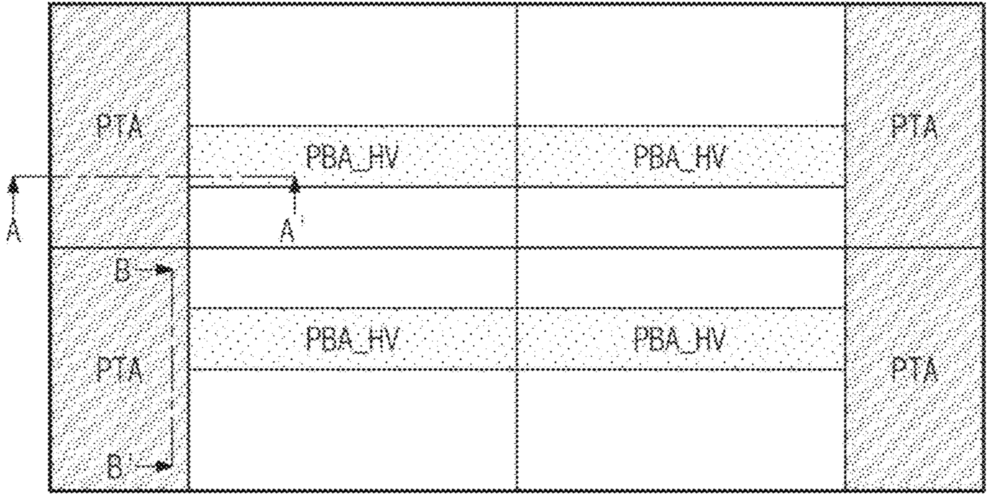
Figure 9B:
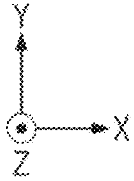
Figure 9C:
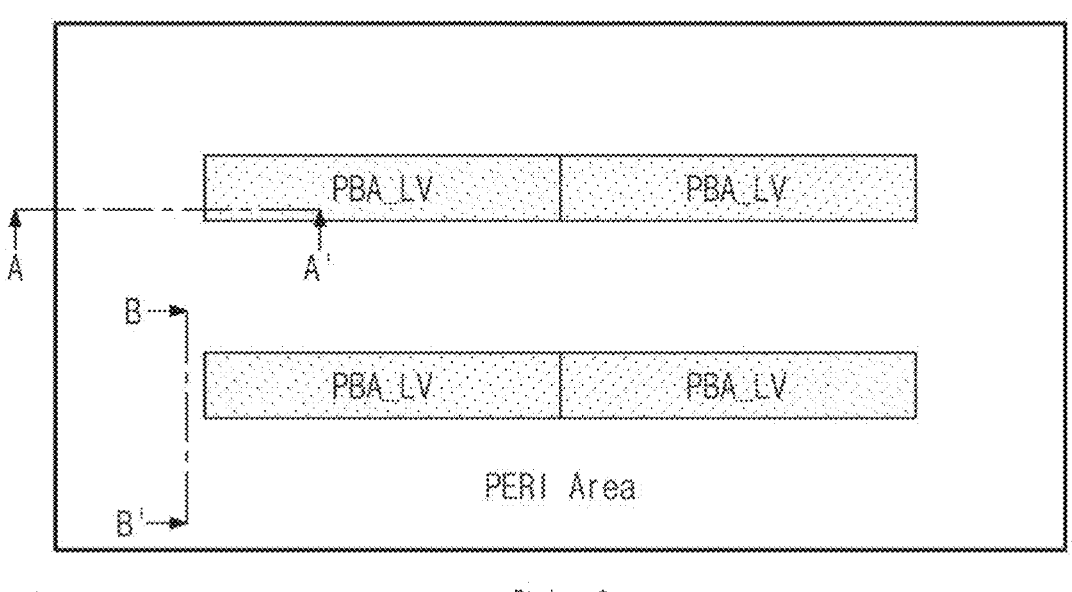
Figure 9C:
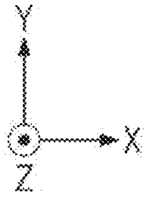

FIGS. 9A to 9C are views illustrating circuit elements of a memory device, which are arranged in different chips according to an example embodiment. In detail, FIG. 9A shows a structure in which memory cell arrays and word line bonding areas WLBA are disposed in a first chip Chip 1. FIG. 9B shows a structure in which pass transistor areas PTA and high-voltage page buffer areas PBA_HV are disposed in a second chip Chip 2. FIG. 9C shows a structure in which low-voltage page buffer areas PBA_LV are disposed in a third chip Chip 3. Example embodiments are not limited to the elements shown in and discussed with reference to FIGS. 9A to 9C, and other circuit elements may be included in the chips.

Referring to FIG. 9A, the memory cell array and the word line bonding area WLBA may be disposed in the first chip Chip 1. As an example, first to fourth memory cell arrays Memory Cell Array 1 to Memory Cell Array 4 may be arranged along an X-axis direction and a Y-axis direction, and the word line bonding area WLBA may be disposed adjacent to a side surface of a corresponding memory cell array among the first to fourth memory cell arrays Memory Cell Array 1 to Memory Cell Array 4. In the word line bonding area WLBA, word lines may extend in the X-axis direction and may be connected to a plurality of cell contact plugs.

Referring to FIG. 9B, the pass transistor group PTG (refer to FIG. 4) and a high-voltage page buffer group PBG_HV (refer to FIG. 4) may be disposed in the second chip Chip 2. An area in which the pass transistor group PTG is disposed may be referred to as the pass transistor area PTA, and an area in which the high-voltage page buffer group PBG_HV is disposed may be referred to as the high-voltage page buffer area PBA_HV.

When viewed in a plan view, the pass transistor area PTA may completely or partially overlap the word line bonding area WLBA. That is, the pass transistors PTs may be disposed in the second chip Chip 2 to be adjacent to the cell contact plugs formed in the first chip Chip 1. Accordingly, a metal line to electrically connect the pass transistor PT and a corresponding cell contact plug may not be required or the metal line may be minimized. Therefore, a deterioration in performance of the memory device due to a parasitic resistance caused by a long metal line may be prevented.

In addition, When viewed in a plan view, the high-voltage page buffer area PBA_HV may completely or partially overlap the memory cell array. That is, high-voltage page buffers PB_HVs may be disposed in the second chip Chip 2 to be adjacent to a bit line BL formed in the first chip Chip 1. Accordingly, a metal line to electrically connect the bit line BL and a corresponding high-voltage page buffer PB_HV may not be required or the metal line may be minimized. Therefore, a deterioration in performance of the memory device due to a parasitic resistance caused by a long metal line may be prevented.

Referring to FIG. 9C, the low-voltage page buffer group PBG_LV (refer to FIG. 4) may be disposed in the third chip Chip 3. An area in which the low-voltage page buffer group PBG_LV is disposed may be referred to as the low-voltage page buffer area PBA_LV.

When viewed in a plan view, the low-voltage page buffer area PBA_LV may completely or partially overlap the high-voltage page buffer area PBA_HV. That is, the low-voltage page buffer PB_LV may be disposed in the third chip Chip 3 to be adjacent to the high-voltage page buffer PB_HV disposed in the second chip Chip 2. Accordingly, a metal line to electrically connect the high-voltage page buffer PB_HV and a corresponding low-voltage page buffer PB_LV may not be required or the metal line may be minimized. Therefore, a deterioration in performance of the memory device due to a parasitic resistance caused by a long metal line may be prevented.

Other circuit elements, such as the input/output circuit 1230, the voltage generator 1240, the control logic 1250, etc., may also be disposed in the third chip Chip 3. In this case, each of the circuit elements may be disposed adjacent to circuit elements that perform associated operations. As an example, the circuit elements that control an operation of the page buffer PB may be disposed adjacent to the low-voltage page buffer area PBA_LV, and thus, a resistance may be reduced to the maximum extent possible.

Figure 10:
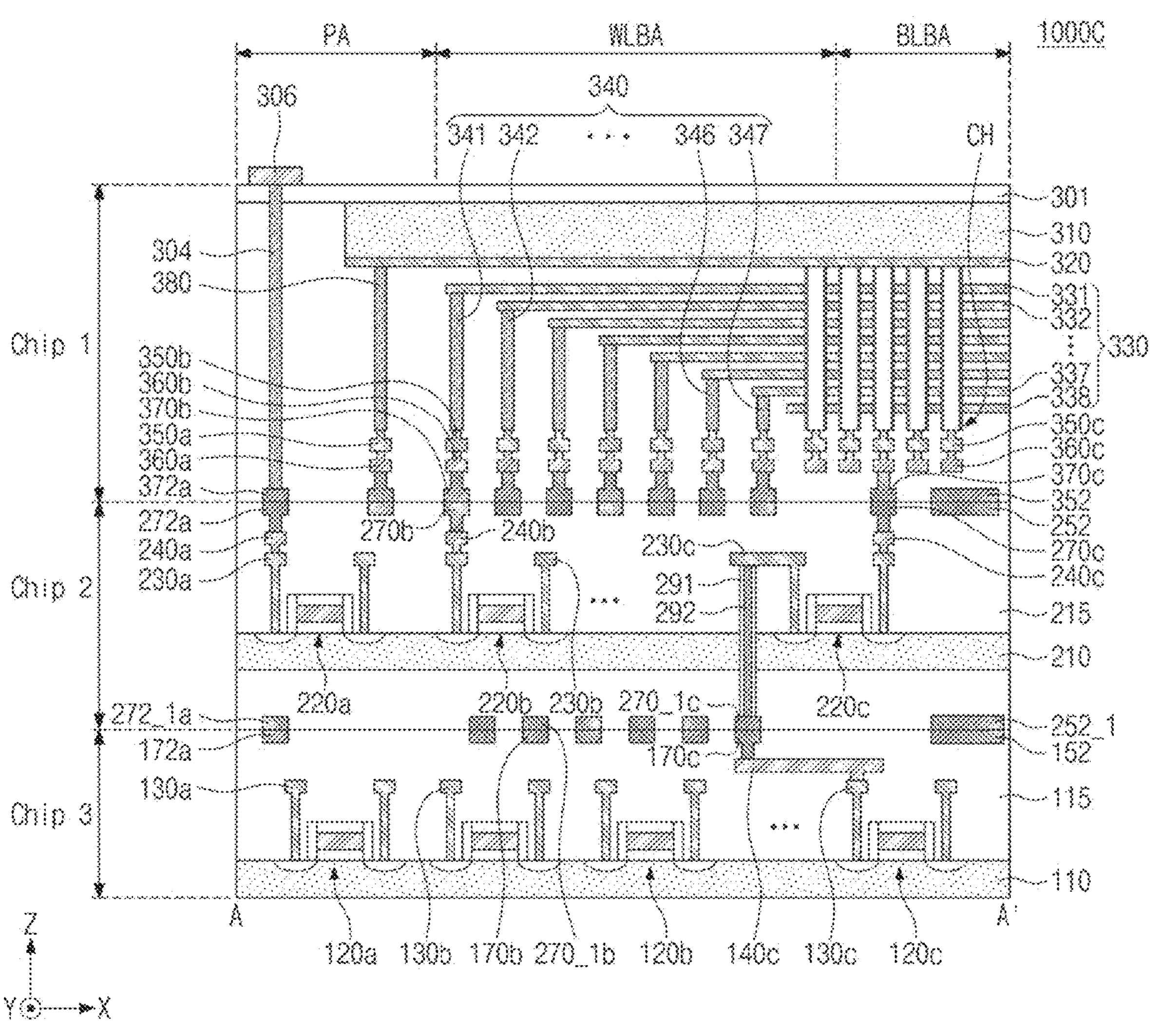
FIG. 10 is a cross-sectional view taken along a line A-A' of FIGS. 9A to 9C according to an example embodiment.

FIG. 10 is a cross-sectional view taken along a line A-A' of FIGS. 9A to 9C.

Referring to FIG. 10, a memory device 1000C may have a C2C structure. In this regard, the first, second, and third chips Chip 1, Chip2, and Chip 3 may be connected to each other by the bonding process in the vertical direction after being separately manufactured. As an example, the bonding process may mean a process of electrically or physically connecting a bonding metal pattern formed at a top metal layer of an upper chip and a bonding metal pattern formed at a top metal layer of a lower chip. As an example, when the bonding metal patterns include copper (Cu), the bonding process may be a Cu—Cu bonding process. As another example, the bonding metal patterns may be formed of aluminum (Al) or tungsten (W).

The memory device 1000C may include the first to third chips Chip 1 to Chip 3, the memory cell array may be formed in the first chip Chip 1, and the peripheral circuit may be formed in the second and third chips Chip 2 and Chip 3. In addition, when viewed in the vertical direction, the memory device 1000C may include a bit line bonding area BLBA, a word line bonding area WLBA, and an external pad bonding area PA.

The third chip Chip 3 may include a substrate 110 and a plurality of circuit elements 120*a*, 120*b*, and 120*c* formed in the substrate 110.

The substrate 110 may have a plate-like shape extending along a plane defined by the X-axis direction and the Y-axis direction. The substrate 110 may be a semiconductor substrate. As an example, the substrate 110 may be, but is not limited to, a bulk silicon substrate, a silicon-on-insulator substrate, a germanium substrate, a germanium-on-insulator substrate, a silicon-germanium substrate, or an epitaxial thin layer formed by a selective epitaxial growth method.

An interlayer insulating layer 115 including one or more insulating layers may be provided on the circuit elements 120*a*, 120*b*, and 120*c*, and a plurality of metal lines may be provided in the interlayer insulating layer 115 to connect the circuit elements 120*a*, 120*b*, and 120*c*. As an example, the metal lines may include first metal lines 130*a*, 130*b*, and 130*c* respectively connected to the circuit elements 120*a*, 120*b*, and 120*c* and a second metal line 140*c* disposed on the first metal line 130*c*. The metal lines may include at least one of various conductive materials. As an example, the first metal lines 130*a*, 130*b*, and 130*c* may be formed of tungsten, which has a relatively high electrical resistivity, and the second metal line 140*c* may be formed of copper, which has a relatively low electrical resistivity.

The interlayer insulating layer 115 may be disposed on the first substrate 110 and may include an insulating material such as silicon oxide, silicon nitride, or the like.

The second chip Chip 2 may include a substrate 210 and a plurality of circuit elements 220*a*, 220*b*, and 220*c* formed in the substrate 210.

Similar to the third chip Chip 3, the substrate 210 of the second chip Chip 2 may have a plate-like shape extending along a plane defined by the X-axis direction and the Y-axis direction. The substrate 210 may be a semiconductor substrate. In addition, similar to the third chip Chip 3, an interlayer insulating layer 215 including one or more insulating layers may be provided on the circuit elements 220*a*, 220*b*, and 220*c*, and a plurality of metal lines may be provided in the interlayer insulating layer 215 to connect the circuit elements 220*a*, 220*b*, and 220*c*.

The third chip Chip 3 and the second chip Chip 2 may be connected to each other by the bonding process. As an example, upper bonding metals 152, 172*a*, 170*b*, and 170*c* may be formed at a top metal layer of the third chip Chip 3, and lower bonding metals 252_1, 272_1*a*, 270_1*b*, and 270_1*c* having shapes corresponding to the upper bonding metals 152, 172*a*, 170*b*, and 170*c* may be formed at a bottom metal layer of the second chip Chip 2. The upper bonding metals 152, 172*a*, 170*b*, and 170*c* of the third chip Chip 3 may be electrically connected to the lower bonding metals 252_1, 272_1*a*, 270_1*b*, and 270_1*c* of the second chip Chip 2 by the bonding process.

Some of the circuit elements of the third chip Chip 3 may be electrically connected to some of the circuit elements of the second chip Chip 2. As an example, the circuit element 120*c* of the third chip Chip 3 may be connected to the circuit element 220*c* of the second chip Chip 2 by a through electrode 292. The through electrode 292 may penetrate the substrate 210. An upper surface of the through electrode 292 may be in contact with a first metal line 230*c* of the second chip Chip 2. A lower surface of the through electrode 292 may be in contact with the bonding metal 270_1*c*. The circuit element 220*c* of the second chip Chip 2 may be electrically connected to the circuit element 120*c* of the third chip Chip 3 through the through electrode 292 and the bonding metals 270_1*c* and 170*c*. In addition, all or a portion of a side surface of the through electrode 292 may be surrounded by a through-electrode insulating layer 291 according to example embodiments.

The circuit element 220*c* of the second chip Chip 2 disposed in the bit line bonding area BLBA and the circuit element 120*c* of the third chip Chip 3 disposed in the bit line bonding area BLBA may constitute the page buffer PB. As an example, the circuit element 220*c* of the second chip Chip 2 may be the high-voltage transistor disposed in the high-voltage page buffer area PBA_HV (refer to FIG. 9B). The circuit element 120*c* of the third chip Chip 3 may be the low-voltage transistor disposed in the low-voltage page buffer area PBA_LV (refer to FIG. 9C).

In this case, the circuit element 220*c* of the second chip Chip 2, which constitutes the high-voltage page buffer PB_HV, and the circuit element 120*c* of the third chip Chip 3, which constitutes the low-voltage page buffer PB_LV, may partially overlap each other when viewed in a plan view. Therefore, a length of a metal line to connect the circuit element 220*c* and the circuit element 120*c* may be minimized, and thus, a parasitic resistance due to the long metal line may be reduced.

The circuit elements 220*a* and 220*b* of the second chip Chip 2, which are respectively disposed in the external pad bonding area PA and the word line bonding area WLBA, may include a high-voltage transistor such as the pass transistor. The circuit elements 120*a* and 120*b* of the third chip Chip 3, which are respectively disposed in the external pad bonding area PA and the word line bonding area WLBA, may include a low-voltage transistor constituting the peripheral circuit such as the input/output circuit, the voltage generator, or the like.

Referring to FIG. 10, the first chip Chip 1 may include a substrate 310 and a common source line 320. A plurality of word lines 331 to 338 (330) may be stacked on the substrate 310 in a direction (e.g., a Z-axis direction) vertical to an upper surface of the substrate 310. String selection lines and a ground selection line may be disposed on and under the word lines 330, and the word lines 330 may be disposed between the string selection lines and the ground selection line. The substrate 310 may be the semiconductor substrate.

A plurality of channel structures CH may be formed in the first chip Chip 1. The channel structures CH may be provided in the bit line bonding area BLBA, may extend in a direction vertical to the upper surface of the substrate 310, and may penetrate the word lines 330, the string selection lines, and the ground selection line. The channel structures CH may include a data storage layer, a channel layer, and a buried insulation layer.

In the word line bonding area WLBA, the word lines 330 of the first chip Chip 1 may extend in the X-axis direction substantially parallel to the upper surface of the substrate 310 and may be connected to a plurality of cell contact plugs 341 to 347 (340). A first metal line 350*b* and a second metal line 360*b* may be sequentially connected to an upper portion of the cell contact plugs 340 connected to the word lines 330. The cell contact plugs 340 may be connected to the circuit element 220*b* of the second chip Chip 2 through an upper bonding metal 370*b* of the first chip Chip 1 and an upper bonding metal 270*b* of the second chip Chip 2. In this case, the circuit element 220*b* of the second chip Chip 2 may be operated as the pass transistor PT.

A common source line contact plug 380 may be disposed in the external pad bonding area PA. The common source line contact plug 380 may be formed of a conductive material, such as a metal, a metal compound, or doped polysilicon. A first metal line 350*a* and a second metal line 360*a* may be sequentially stacked on an upper portion of the common source line contact plug 380. The common source line contact plug 380 may be electrically connected to the circuit element of the second chip Chip 2.

An input/output pad 306 may be disposed in the external pad bonding area PA. As an example, an upper insulating layer 301 may be disposed on the substrate 310 to cover the upper surface of the substrate 310. The input/output pad 306 may be disposed on the upper insulating layer 301. The input/output pad 306 may be electrically connected to one of the circuit elements of the second chip Chip 2 and/or the third chip Chip 3 through an input/output contact plug 304.

The first chip Chip 1 and the second chip Chip 2 may be connected to each other by the bonding process. As an example, upper bonding metals 352, 372*a*, 370*b*, and 370*c* may be formed at a top metal layer of the first chip Chip 1, and upper bonding metals 252, 272*a*, 270*b*, and 270*c* having shapes corresponding to those of the upper bonding metals 352, 372*a*, 370*b*, and 370*c* may be formed at a top metal layer of the second chip Chip 2. The upper bonding metals 352, 372*a*, 370*b*, and 370*c* of the first chip Chip 1 may be electrically connected to the upper bonding metals 252, 272*a*, 270*b*, and 270*c* of the second chip Chip 2 by the bonding process.

Figure 11A:
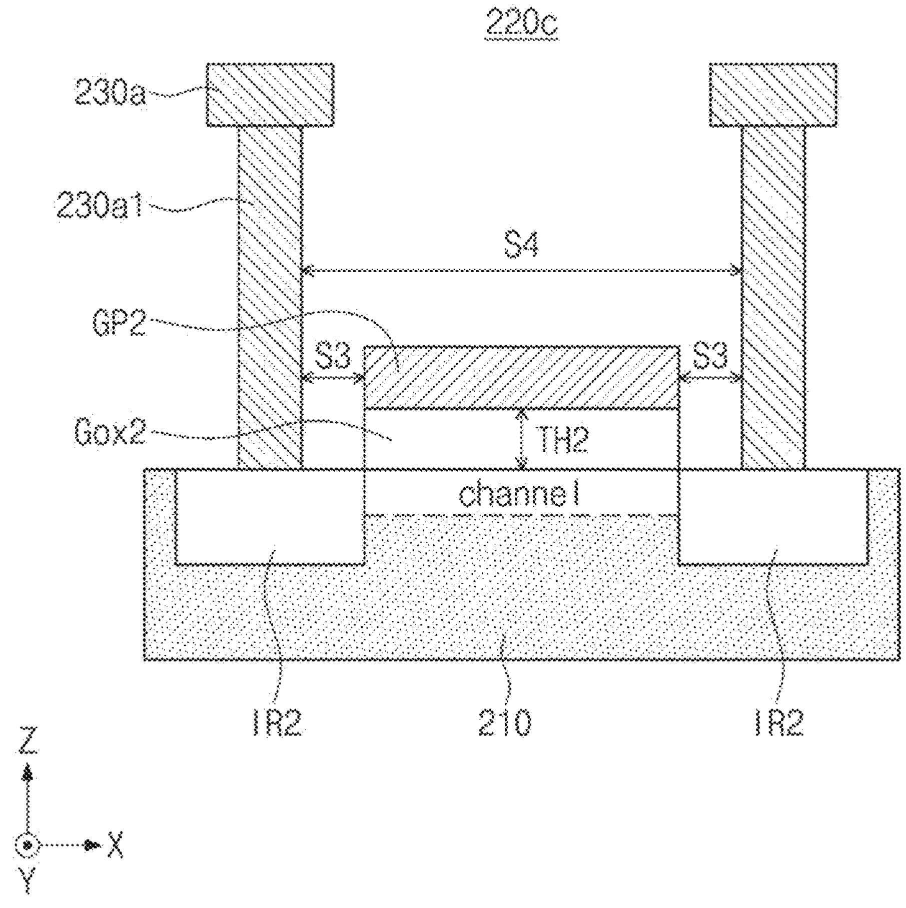
FIG. 11A is a view illustrating a high-voltage transistor according to an example embodiment.
Figure 11B:
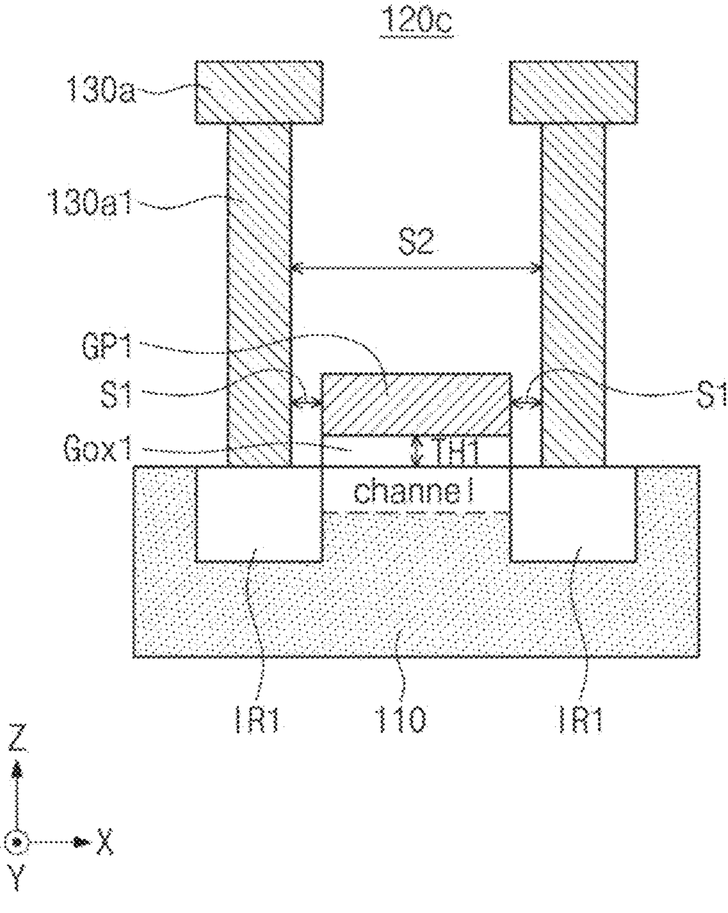
FIG. 11B is a view illustrating a low-voltage transistor according to an example embodiment.

FIG. 11A is a view illustrating a high-voltage transistor according to an example embodiment, and FIG. 11B is a view illustrating a low-voltage transistor according to an example embodiment. As an example, the high-voltage transistor of FIG. 11A may be the circuit element 220*c* formed in the second chip Chip 2 of FIG. 10, and the low-voltage transistor of FIG. 11B may be the circuit element 120*c* formed in the third chip Chip 3 of FIG. 10.

Referring to FIG. 11A, the circuit element 220*c* of the second chip Chip 2 may be the high-voltage transistor. The circuit element 220*c* may include the substrate 210, second impurity regions IR2, a second gate pattern GP2, a second gate insulating layer Gox2, metal contacts 230*al*, and metal lines 230*a*. The second impurity region IR2 may be defined in the substrate 210. As an example, the second impurity region IR2 may be defined in a well region of the substrate 210.

Referring to FIG. 11B, the circuit element 120*c* of the third chip Chip 3 may be the low-voltage transistor. The circuit element 120*c* may include the substrate 110, first impurity regions IR1, a first gate pattern GP1, a first gate insulating layer Gox1, metal contacts 130*al*, and metal lines 130*a*. The first impurity region IR1 may be defined in the substrate 110. As an example, the first impurity region IR1 may be defined in a well region WELL of the substrate 110.

Referring to FIGS. 11A and 11B, a size of the circuit element 220*c* that is the high-voltage transistor may be formed greater than a size of the circuit element 120*c* that is the low-voltage transistor.

The second gate insulating layer Gox2 of the circuit element 220*c* that is the high-voltage transistor may have a thickness TH2 greater than a thickness TH1 of the first gate insulating layer Gox1 of the circuit element 120*c* that is the low-voltage transistor. According to an example embodiment, a distance S3 between the gate pattern GP2 and the metal contact 230*al* of the circuit element 220*c* that is the high-voltage transistor may be greater than a distance S1 between the gate pattern GP1 and the metal contact 130*al* of the circuit element 120*c* that is the low-voltage transistor. According to an example embodiment, a distance S4 between the metal contacts 230*al* of the circuit element 220*c* that is the high-voltage transistor may be greater than a distance S2 between the metal contacts 130*a*1 of the circuit element 120*c* that is the low-voltage transistor.

According to the memory device 1000C, because relatively few high-voltage transistors are disposed in the second chip Chip 2 and the high-voltage transistors are separated from the circuit elements of other peripheral circuits, the high-voltage transistors may have sufficient width or length, and consequently, the performance of the high-voltage transistor may be improved.

Figure 12:
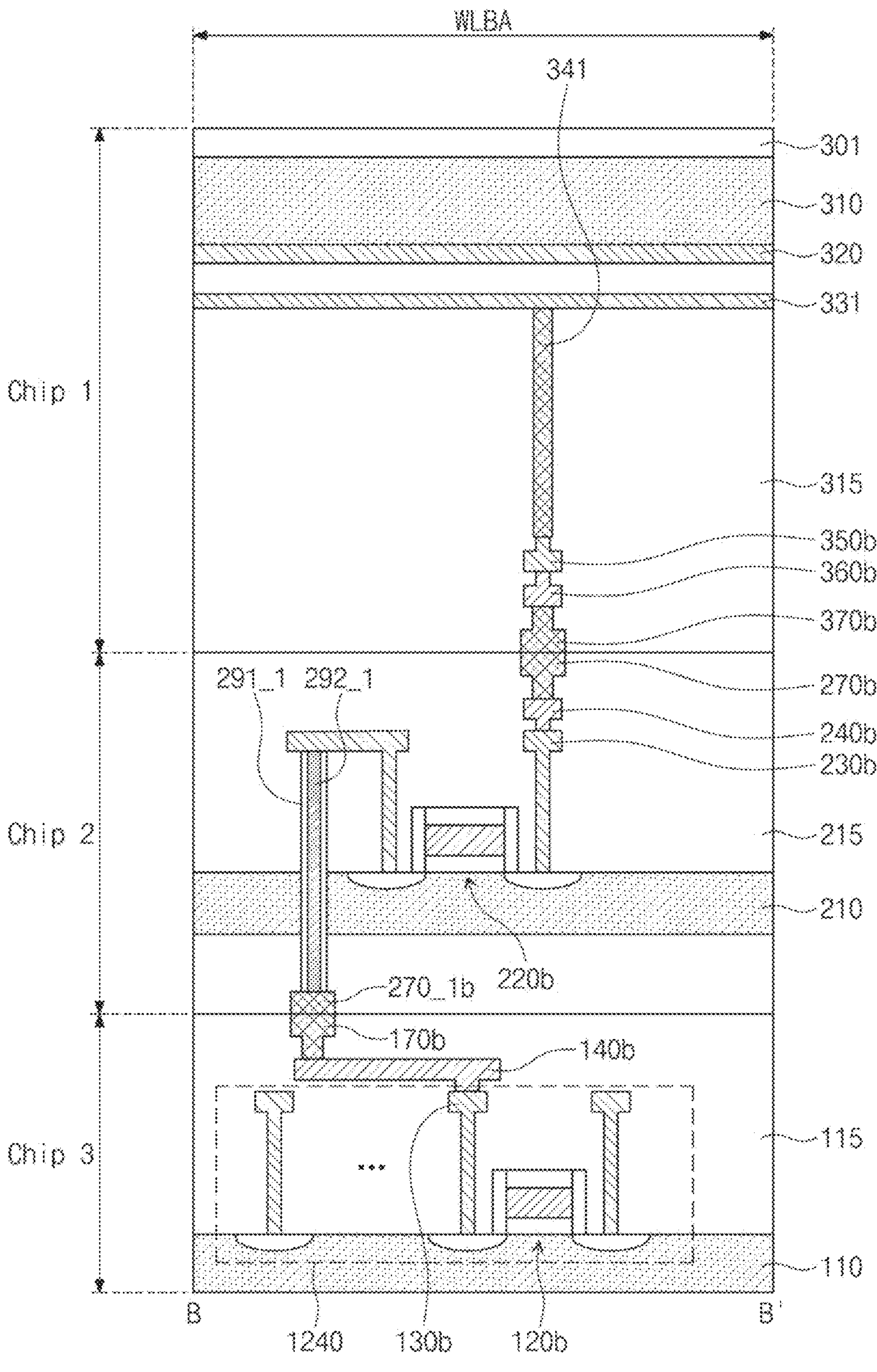
FIG. 12 is a cross-sectional view taken along a line B-B' of FIGS. 9A to 9C according to an example embodiment.

FIG. 12 is a cross-sectional view taken along a line B-B' of FIGS. 9A to 9C. FIG. 12 shows a connection relationship between the word line and the pass transistor. The structure shown in FIG. 12 is similar to that of FIGS. 10, 11A and 11B, and thus, repeated descriptions of the similar structure will be omitted.

Referring to FIG. 12, in the word line bonding area WLBA, the word line 331 and the cell contact plug 341 may be formed in the first chip Chip 1, and the circuit element 220*b* that is the pass transistor may be formed in the second chip Chip 2. The circuit element 120*b* constituting the voltage generator 1240 may be formed in the third chip Chip 3.

In the first chip Chip 1, a lower portion of the cell contact plug 341 may be connected to the word line 331. The metal lines 350*b* and 360*b* and the bonding metal 370*b* may be sequentially connected to an upper portion of the cell contact plug 341.

In the second chip Chip 2, the metal lines 230*b* and 240*b* and the bonding metal 270*b* may be sequentially connected to an upper portion of the circuit element 220*b*. The circuit element 220*b* may be connected to the corresponding word line 331 through the metal lines, the bonding metals, and the cell contact plug 341. The circuit element 220*b* may be the pass transistor.

In addition, the circuit element 220*b* of the second chip Chip 2 may be electrically connected to the circuit element 120*b* of the third chip Chip 3 through a through electrode 292_1. The through electrode 2921 may penetrate the substrate 210. An upper surface of the through electrode 2921 may be in contact with the first metal line 230*b* of the second chip Chip 2, and a lower surface of the through electrode 292_1 may be in contact with the bonding metal 270_1*b*. All or a portion of a side surface of the through electrode 292_1 may be surrounded by a through-electrode insulating layer 2911.

In the third chip Chip 3, the metal lines 130*b* and 140*b* and the bonding metal 170*b* may be sequentially connected to an upper portion of the circuit element 120*b*. The circuit element 120*b* may be electrically connected to the circuit element 220*b* of the second chip Chip 2 through the metal lines and the bonding metals. As an example, the circuit element 120*b* of the third chip Chip 3 may constitute the voltage generator 1240 that generates the high voltage. In this case, the voltage generated by the voltage generator 1240 of the third chip Chip 3 may be applied to the word line of the first chip Chip 1 depending on whether the circuit element 220*b* of the second chip Chip 2 is turned on or not.

In this case, the circuit element 220*b* of the second chip Chip 2 may be implemented by the high-voltage transistor, and the circuit element 120*b* of the third chip Chip 3 may be implemented by the low-voltage transistor. In addition, the circuit element 220*b* of the second chip Chip 2 and the circuit element 120*b* of the third chip Chip 3 may be disposed to overlap each other along the vertical direction. Accordingly, a length of a metal line to connect the circuit element 220*b* and the circuit element 120*b* may be minimized, and thus, the parasitic resistance due to the metal line may be reduced.

Figure 13:
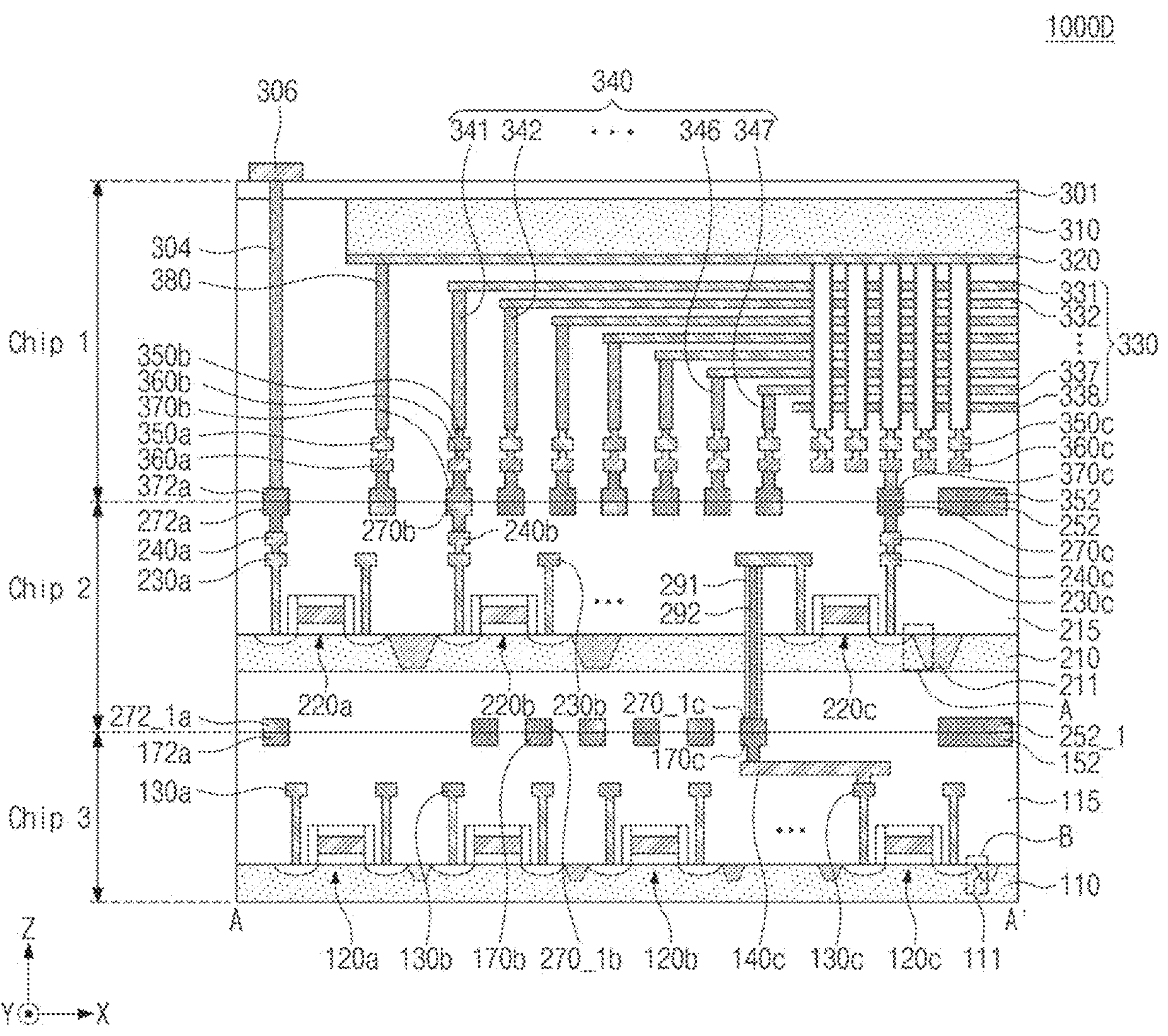
FIG. 13 is a cross-sectional view taken along a line A-A' of FIGS. 9A to 9C according to an example embodiment.
Figure 14A:
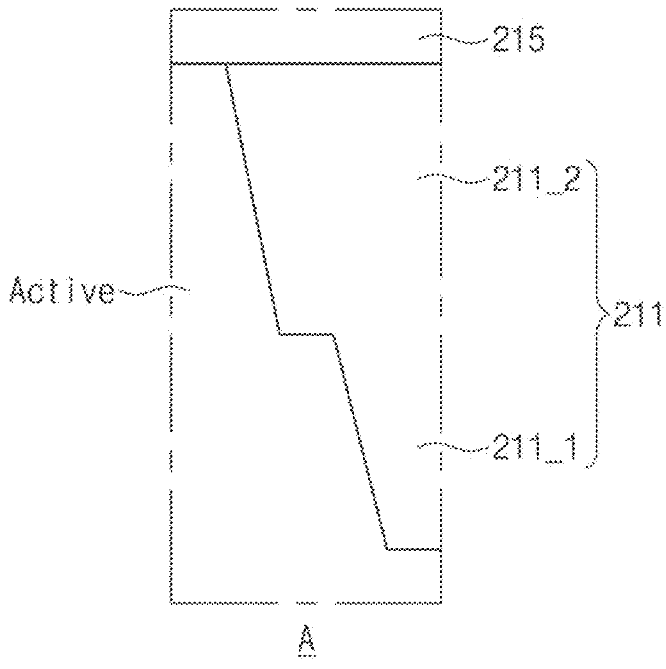
FIG. 14A is a view illustrating an area A of FIG. 13 in more detail according to an example embodiment.
Figure 14B:
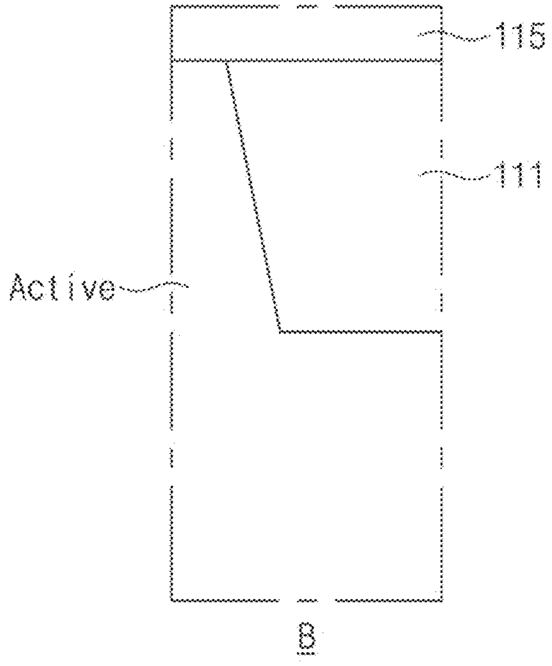
FIG. 14B is a view illustrating an area B of FIG. 13 in more detail.

FIG. 13 is a cross-sectional view taken along a line A-A' of FIGS. 9A to 9C according to an example embodiment. FIG. 14A is a view illustrating an area A of FIG. 13 in more detail, and FIG. 14B is a view illustrating an area B of FIG. 13 in more detail.

The memory device 1000D of FIG. 13 is similar to the memory device 1000C of FIG. 10. Accordingly, in FIG. 13, the same or similar reference numerals denote the same or similar elements in FIG. 10, and thus, repeated descriptions of the same elements will be omitted.

Referring to FIG. 13, an element isolation area 211 may be formed in a second chip Chip 2, and an element isolation area 111 may also be formed in a third chip Chip 3. The element isolation area 211 of the second chip Chip 2 may be formed in a substrate 210 and may define active areas in the substrate 210. The element isolation area 111 of the third chip Chip 3 may be formed in a substrate 110 and may define active areas in the substrate 110.

In this case, the element isolation area 211 defined between high-voltage transistors of the second chip Chip 2 may be formed deeper than the element isolation area 111 defined between low-voltage transistors of the third chip Chip 3.

As an example, the element isolation area 211 of the second chip Chip 2 may include a deep element isolation area 211_1 and a shallow element isolation area 211_2 as shown in FIG. 14A. The deep element isolation area 2111 may be formed by filling a deep trench with a trench insulating material. The shallow element isolation area 211_2 may be formed by filling a shallow trench with a trench insulating material. The trench insulating material may include, for example, silicon oxide such as a tonen silazane (TOSZ) or an un-doped silicate glass (USG).

As an example, the element isolation area 111 of the third chip Chip 3 may be a shallow element isolation area as shown in FIG. 14B. That is, the element isolation area 111 of the third chip Chip 3 may be formed by filling a shallow trench with a trench insulating material.

As described above, the element isolation area 211 formed in the second chip Chip 2 in which the high-voltage transistors are disposed may be formed deeper than the element isolation area 111 formed in the third chip Chip 3 in which the low-voltage transistors are disposed.

Figure 15:
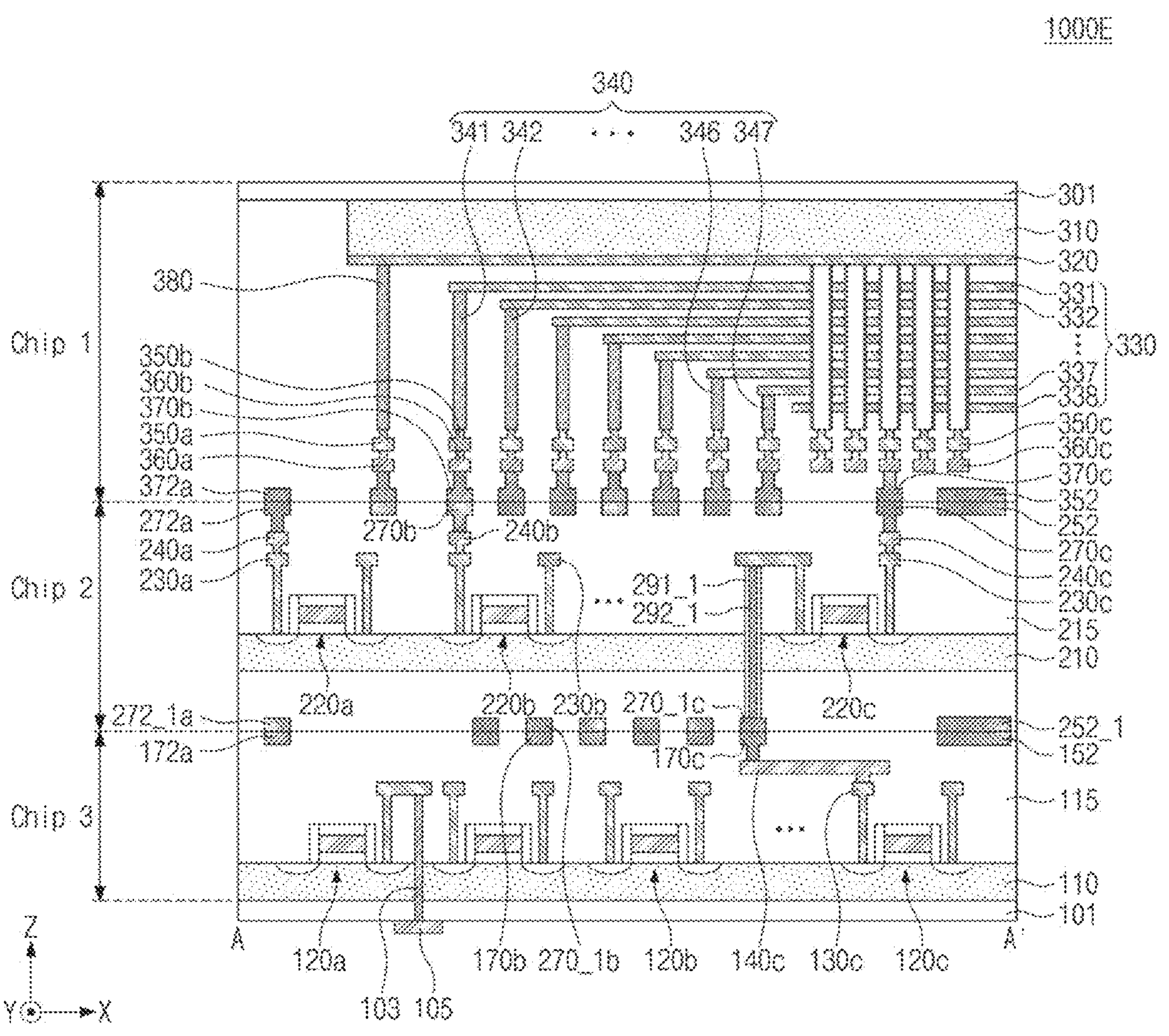
FIG. 15 is a cross-sectional view taken along a line A-A' of FIGS. 9A to 9C according to an example embodiment.

FIG. 15 is a cross-sectional view taken along a line A-A' of FIGS. 9A to 9C according to an example embodiment.

The memory device 1000E of FIG. 15 is similar to the memory devices 1000C and 1000D of FIGS. 10 and 13. Accordingly, in FIG. 15, the same or similar reference numerals denote the same or similar elements in FIGS. 10 and 13, and thus, repeated descriptions of the same elements will be omitted.

As discussed above with reference to FIGS. 10 and 13, the input/output pad may be formed in the first chip Chip 1, However, this is an example, and the input/output pad may be formed at various positions according to example embodiments.

As an example, a lower insulating layer 101 may cover a lower surface of a substrate 110 of a third chip Chip 3, and an input/output pad 105 may be formed on the lower insulating layer 101 as shown in FIG. 15. The input/output pad 105 may be connected to at least one of a plurality of circuit elements 120*a*, 120*b*, and 120*c* disposed in the third chip Chip 3 through an input/output contact plug 103 and may be separated from the substrate 110 by the lower insulating layer 101. In addition, a side-surface insulating layer may be disposed between the input/output contact plug 103 and the substrate 110. For example, the side-surface insulating layer may surround the input/output contact plug 103 between the input/output contact plug 103 and the substrate 110. Thus, the input/output contact plug 103 may be electrically separated from the substrate 110.

Figure 16:
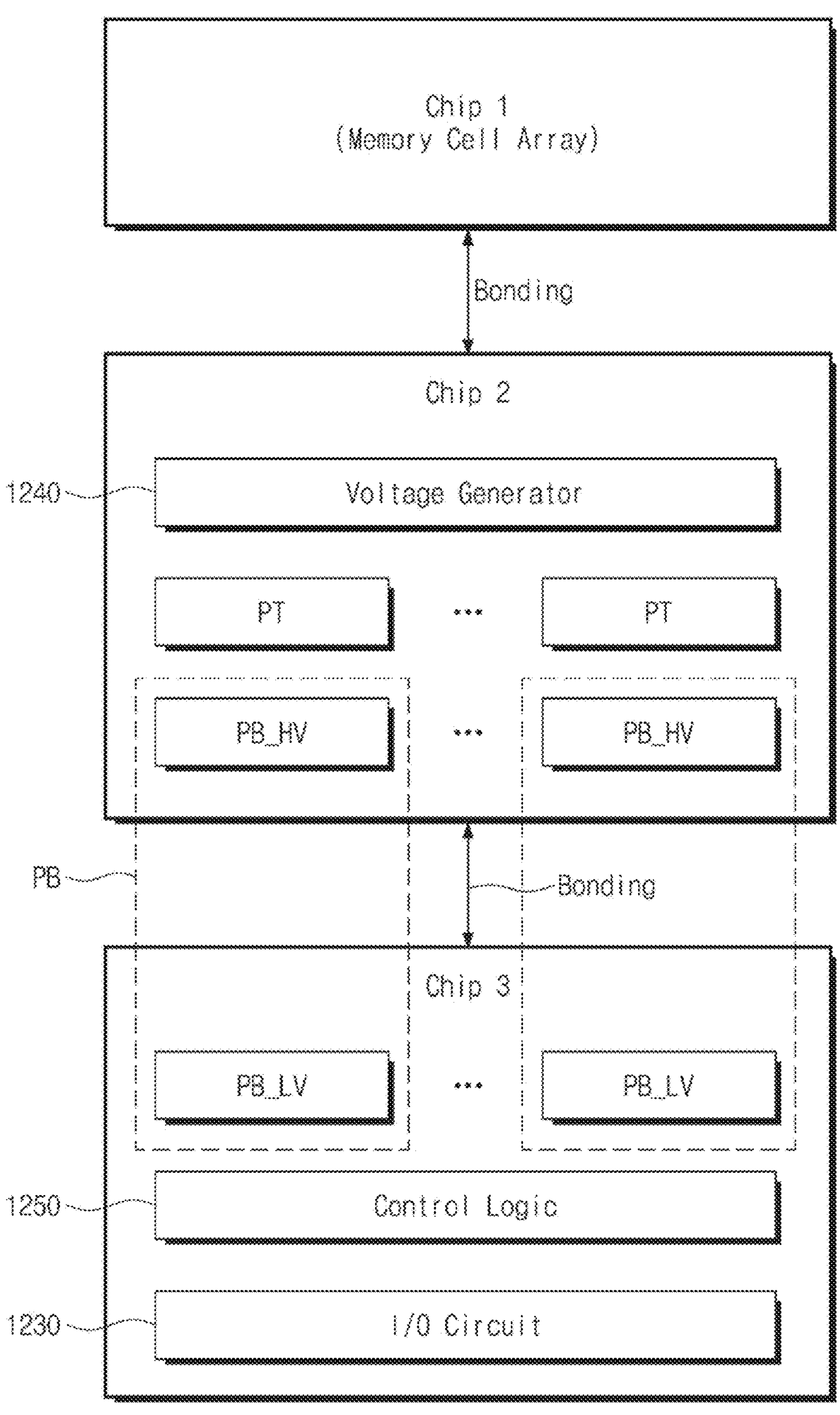
FIGS. 16 and 17 are block diagrams illustrating a memory device of FIG. 4 arranged in first to third chips according to example embodiments.
Figure 17:
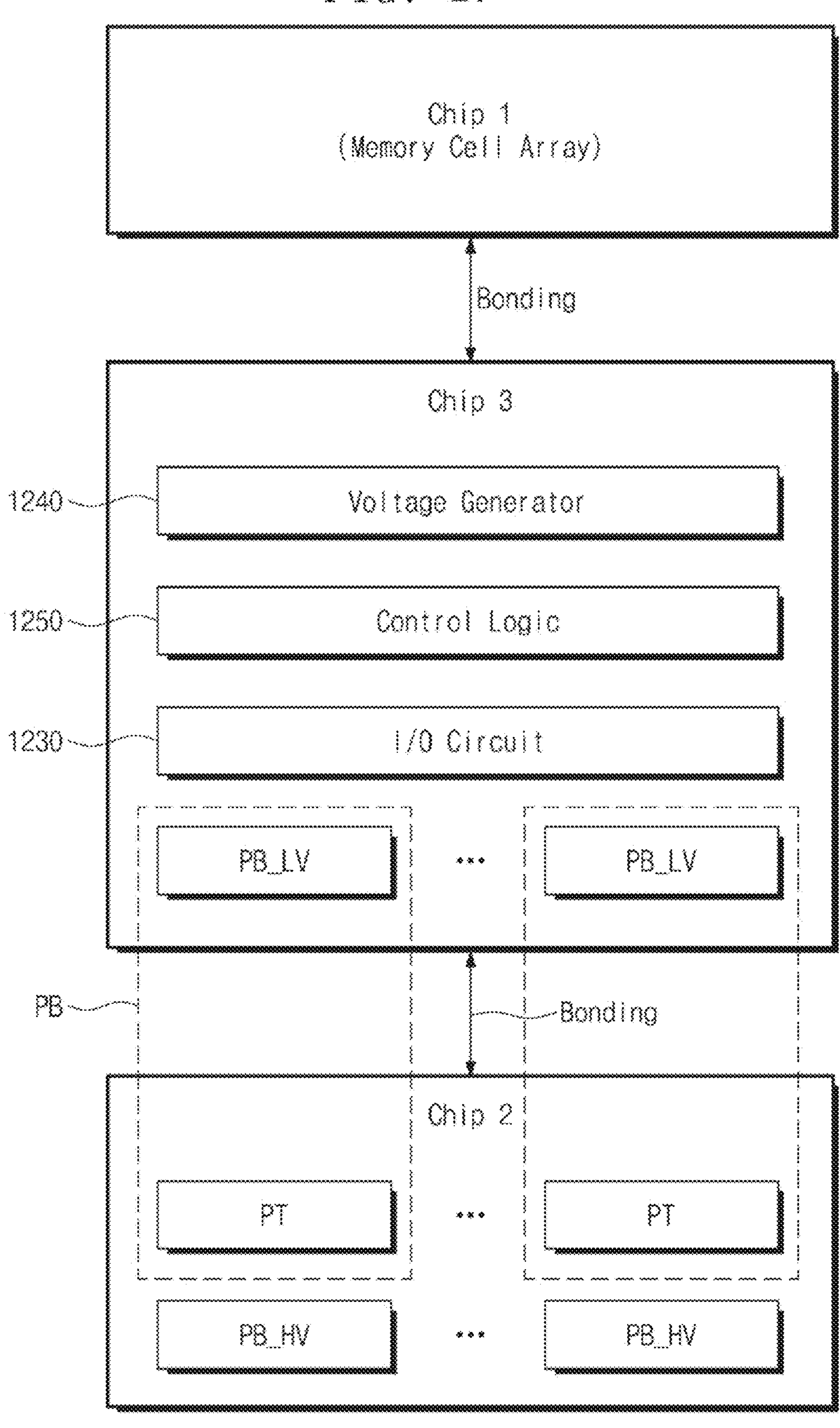

FIGS. 16 and 17 are block diagrams illustrating memory devices of FIG. 4 arranged in first to third chips Chip 1 to Chip 3 according to example embodiments. The memory devices of FIGS. 16 and 17 are similar to that of FIG. 8. Accordingly, in FIGS. 16 and 17, the same or similar reference numerals denote the same or similar elements in FIG. 8, and thus, repeated descriptions of the same elements will be omitted.

As discussed above with reference to FIGS. 4 to 15, in some example embodiments only the high-voltage transistors are disposed in the second chip Chip 2. However, this is an example and example embodiments are not limited thereto or thereby.

As an example, referring to FIG. 16, in addition to a pass transistor PT and a high-voltage page buffer PB_HV, which are high-voltage transistors, a low-voltage transistor may also be disposed in the second chip Chip 2. A circuit element disposed in the second chip Chip 2 and including the low-voltage transistor may be referred to as a fourth peripheral circuit unit. As an example, a voltage generator 1240 may be implemented to include the low-voltage transistor, and the voltage generator 1240 may be disposed in the second chip Chip 2. In this case, the voltage generator 1240 may be disposed in an area other than the area in which the pass transistor PT and the high-voltage page buffer PB_HV are disposed. Accordingly, a space within the second chip Chip 2 may be efficiently used.

In addition, as discussed above with reference to FIGS. 4 to 15, the first chip Chip 1 in which the memory cell array is disposed may be connected to the second chip Chip 2 in which the high-voltage transistors are disposed by the bonding process, however, this is an example and example embodiments are not limited thereto or thereby.

As an example, referring to FIG. 17, the first chip Chip 1 may be connected to the third chip Chip 3 in which low-voltage transistors are mainly disposed by a bonding process, and the third chip Chip 3 may be connected to the second chip Chip 2 in which high-voltage transistors are disposed by a bonding process.

Figure 18:
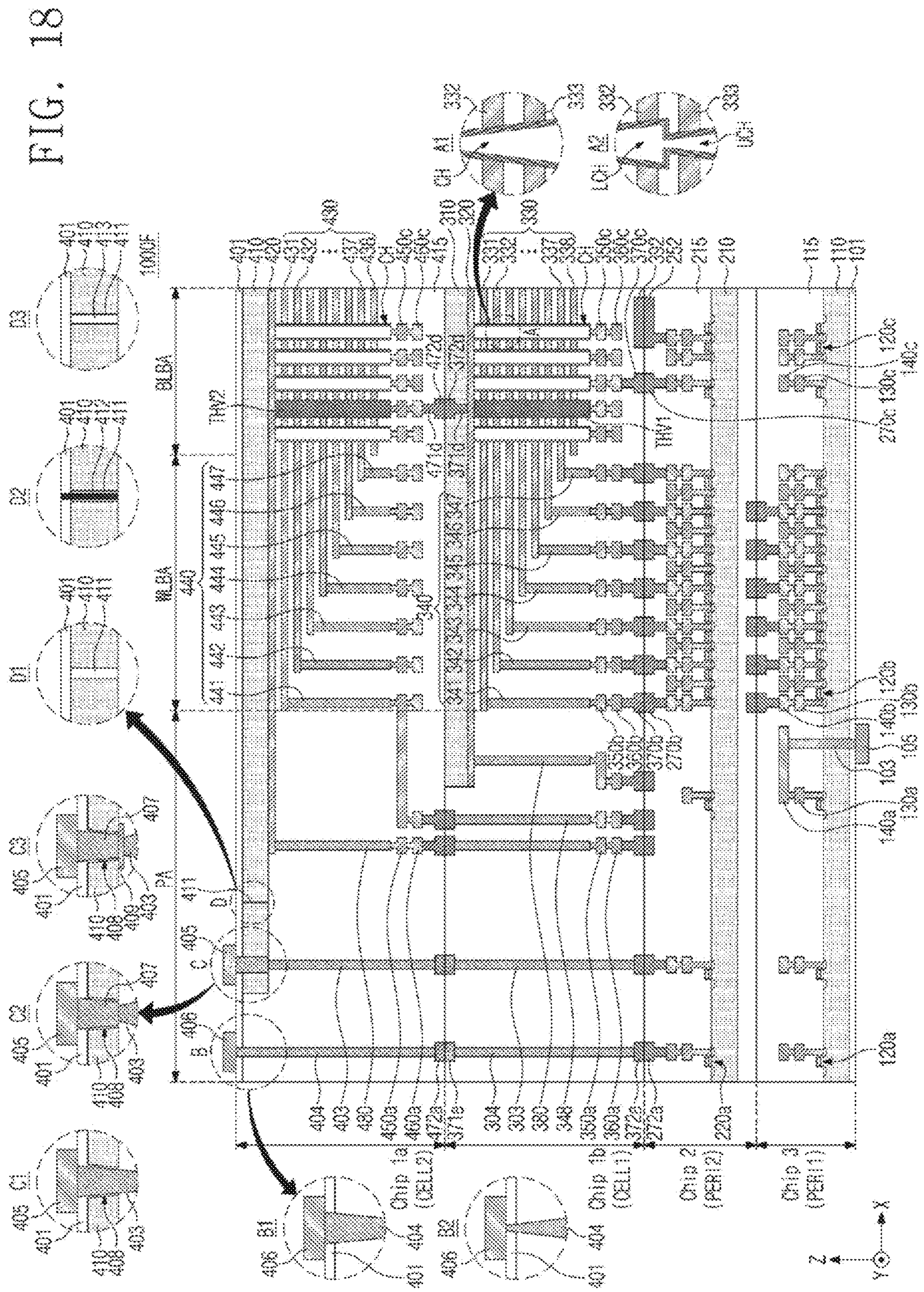
FIG. 18 is a cross-sectional view taken along a line A-A' of FIGS. 9A to 9C according to an example embodiment.

FIG. 18 is a cross-sectional view taken along a line A-A' of FIGS. 9A to 9C according to an example embodiment. For the convenience of explanation, in FIG. 18, various structures that are changeable and applicable to a memory device according to an example embodiment are comprehensively illustrated.

For the convenience of explanation, it is assumed that two chips Chip 1*a* and Chip 1*b* in which a memory cell array is formed are connected to two chips Chip 2 and Chip 3 in which a peripheral circuit is formed by a bonding process in the memory device 1000F of FIG. 18. In addition, in the following descriptions, a first-a chip Chip 1*a* and a first-b chip Chip 1*b* may be referred to as a first cell area CELL1 and a second cell area CELL2, respectively, and a second chip Chip 2 and a third chip Chip 3 may be referred to as a first peripheral circuit area PERI1 and a second peripheral circuit area PERI2, respectively.

The two chips Chip 1*a* and Chip 1*b* in which the memory cell array is formed may be referred to as a cell area, and the two chips Chip 2 and Chip 3 in which the peripheral circuit is formed may be referred to as a peripheral circuit area.

Referring to FIG. 18, the memory device 1000F may have a chip-to-chip (C2C) structure. The C2C structure may be obtained by manufacturing at least one upper chip including a cell area CELL and at least one lower chip including a peripheral circuit area PERI and connecting the upper chip and the lower chip by a bonding process. As an example, the bonding process may indicate a process of electrically or physically connecting a bonding metal pattern formed at a top metal layer of the upper chip and a bonding metal pattern formed at a top metal layer of the lower chip. As an example, when the bonding metal patterns are formed of copper (Cu), the bonding process may be a Cu—Cu bonding process. According to an example embodiment, the bonding metal patterns may be formed of aluminum (Al) or tungsten (W).

The memory device 1000F may include at least one upper chip including the cell area. In addition, the memory device 1000F may include at least one lower chip including the peripheral circuit area. As an example, the memory device 1000F may include two upper chips and two lower chips, as shown in FIG. 18. However, this is an example, and the number of the upper chips and the number of the lower chips should not be limited thereto or thereby.

When the memory device 1000F includes two upper chips and two lower chips, the memory device 1000F may be manufactured by manufacturing the first-a and first-b chips Chip 1*a* and Chip 1*b* including the cell area, and the second and third chips Chip 2 and Chip 3 including the peripheral circuit area and connecting the first to third chips, by the bonding process. The first-a chip Chip 1*a* may be connected to the first-b chip Chip 1*b* by the bonding process after being inverted, and the first-b chip Chip 1*b* may be connected to the second chip Chip 2 by the bonding process after being inverted.

In the following descriptions, upper and lower portions of the first-a and first-b chips are defined based on the orientation of the first-a chip and first-b chip before being inverted. That is, in FIG. 18, upper portions of the second and third chips Chip 2 and Chip 3 are defined with respect to a +Z-axis direction, and the upper portions of the first-a and first-b chips Chip 1*a* and Chip 1*b* are defined with respect to a −Z-axis direction, however, this is an example. According to an example embodiment, only one of the first-a chip and the first-b chip may be reversed and may be connected by the bonding process.

In the memory device 1000F, each of the first and second peripheral circuit areas PERI1 and PERI2 and each of the first and second cell areas CELL1 and CELL2 may include an external pad bonding area PA, a word line bonding area WLBA, and a bit line bonding area BLBA.

The peripheral circuit may include the first and second peripheral circuit areas PERI1 and PERI2 vertically stacked in the Z-axis direction. However, this is an example, and the number of the vertically stacked peripheral circuit areas should not be limited thereto or thereby.

The first peripheral circuit area PERI1 may include a first substrate 110 and a plurality of circuit elements 120*a*, 120*b*, and 120*c* formed in the first substrate 110.

The first substrate 110 may have a plate-like shape extending along a plane defined by first and second horizontal directions (the X-axis direction and the Y-axis direction). The first substrate 110 may be a semiconductor substrate. As an example, the substrate 110 may be, but is not limited to, a bulk silicon substrate, a silicon-on-insulator substrate, a germanium substrate, a germanium-on-insulator substrate, a silicon-germanium substrate, or an epitaxial thin layer formed by a selective epitaxial growth method.

An interlayer insulating layer 115 including one or more insulating layers may be provided on the circuit elements 120*a*, 120*b*, and 120*c*, and a plurality of metal lines may be provided in the interlayer insulating layer 115 to connect the circuit elements 120*a*, 120*b*, and 120*c*. As an example, the metal lines may include first metal lines 130*a*, 130*b*, and 130*c* respectively connected to the circuit elements 120*a*, 120*b*, and 120*c* and second metal lines 140*a*, 140*b*, and 140*c* disposed on the first metal lines 130*a*, 130*b*, and 130*c*, respectively. The metal lines may include at least one of various conductive materials. As an example, the first metal lines 130*a*, 130*b*, and 130*c* may be formed of tungsten, which has a relatively high electrical resistivity, and the second metal lines 140*a*, 140*b*, and 140*c* may be formed of copper, which has a relatively low electrical resistivity.

Although only the first metal lines 130*a*, 130*b*, and 130*c* and the second metal lines 140*a*, 140*b*, and 140*c* are shown and described, example embodiments are not limited thereto or thereby. According to an example embodiment, one or more additional metal lines may be further formed on the second metal lines 140*a*, 140*b*, and 140*c*. In this case, the second metal lines 140*a*, 140*b*, and 140*c* may be formed of aluminum. At least a portion of the one or more additional metal lines formed on the second metal lines 140*a*, 140*b*, and 140*c* may be formed of copper that has an electrical resistivity lower than aluminum used in the second metal lines 140*a*, 140*b*, and 140*c*.

The interlayer insulating layer 115 may be disposed on the first substrate 110 and may include an insulating material such as silicon oxide, silicon nitride, or the like.

The second peripheral circuit area PERI2 may include a second substrate 210 and a plurality of circuit elements 220*a*, 220*b*, and 220*c* formed on the second substrate 210.

The second substrate 210 may have a plate-like shape extending along a plane defined by the first and second horizontal directions (the X-axis direction and the Y-axis direction). The second substrate 210 may be a semiconductor substrate.

An interlayer insulating layer 215 including one or more insulating layers may be provided on the circuit elements 220*a*, 220*b*, and 220*c*, and a plurality of metal lines may be provided in the interlayer insulating layer 215 to connect the circuit elements 220*a*, 220*b*, and 220*c*. In addition, some of the circuit elements 220*a*, 220*b*, and 220*c* on the second substrate 210 may be electrically connected to some of the circuit elements 120*a*, 120*b*, and 120*c* on the first substrate 110.

Each of the first and second cell areas CELL1 and CELL2 may include at least one memory block. The first cell area CELL1 may include a third substrate 310 and a common source line 320. A plurality of word lines 331 to 338 (330) may be stacked on the third substrate 310 in a direction (e.g., the Z-axis direction) vertical to an upper surface of the third substrate 310. String selection lines and a ground selection line may be disposed on and under the word lines 330, respectively, and the word lines 330 may be disposed between the string selection lines and the ground selection line.

Similarly, the second cell area CELL2 may include a fourth substrate 410 and a common source line 420, and a plurality of word lines 431 to 438 (430) may be stacked on the fourth substrate 410 in the direction (e.g., the Z-axis direction) vertical to an upper surface of the fourth substrate 410. The third substrate 310 and the fourth substrate 410 may include various materials and may be a silicon substrate, a silicon-germanium substrate, a germanium substrate, or a substrate including a monocrystalline epitaxial layer grown on a monocrystalline silicon substrate. A plurality of channel structures CH may be formed in each of the first and second cell areas CELL1 and CELL2.

According to an example embodiment, as shown in an area A1, a channel structure CH may be provided in a bit line bonding area BLBA and may extend in a direction vertical to an upper surface of a third substrate 310 to penetrate word lines 330, string selection lines, and a ground selection line. The channel structure CH may include a data storage layer, a channel layer, and a buried insulation layer. The channel layer may be electrically connected to a first metal line 350*c* and a second metal line 360*c* in the bit line bonding area BLBA. As an example, the second metal line 360*c* may be a bit line and may be connected to the channel structure CH through the first metal line 350*c*. The bit line 360*c* may extend in the first horizontal direction (the Y-axis direction) substantially parallel to the upper surface of the third substrate 310.

According to an example embodiment, as shown in an area A2, a channel structure CH may include a lower channel LCH and an upper channel UCH connected to the lower channel LCH. As an example, the channel structure CH may be formed through a process for the lower channel LCH and a separate process for the upper channel UCH. The lower channel LCH may extend in the direction vertical to an upper surface of a third substrate 310 and may penetrate a common source line 320 and lower word lines 331 and 332. The lower channel LCH may include a data storage layer, a channel layer, and a buried insulation layer and may be connected to the upper channel UCH. The upper channel UCH may penetrate upper word lines 333 to 338. The upper channel UCH may include a data storage layer, a channel layer, and a buried insulation layer, and the channel layer of the upper channel UCH may be electrically connected to a first metal line 350*c* and a second metal line 360*c*. As a length of the channel increases, it becomes more difficult to form the channel with a uniform width due to process-related reasons. The memory device 1000F may have the channel with uniformity through the lower channel LCH and the upper channel UCH, which are formed through sequential processes.

As shown in the area A2, when the channel structure CH includes the lower channel LCH and the upper channel UCH, a word line located near a boundary between the lower channel LCH and the upper channel UCH may be a dummy word line. As an example, a word line 432 and a word line 433, which form the boundary between the lower channel LCH and the upper channel UCH may be the dummy word line. In this case, data may not be stored in memory cells connected to the dummy word line. The number of pages corresponding to the memory cells connected to the dummy word line may be smaller than the number of pages corresponding to memory cells connected to a normal word line. A level of a voltage applied to the dummy word line may be different from a level of a voltage applied to the normal word line, and thus, influences of uneven channel width between the lower channel LCH and the upper channel UCH on the operation of the memory device may be reduced.

In the area A2, the number of the lower word lines 331 and 332 through which the lower channel LCH penetrates is smaller than the number of the upper word lines 333 to 338 through which the upper channel UCH penetrates. However, this is an example, and example embodiments are not limited thereto or thereby. According to an example embodiment, the number of the lower word lines through which the lower channel LCH penetrates may be equal to or greater than the number of the upper word lines through which the upper channel UCH penetrates. In addition, the structure and connection relationship of the channel structure CH disposed in the first cell area CELL1 described above may be applied to a channel structure CH disposed in the second cell area CELL2.

In the bit line bonding area BLBA, a first through electrode THV1 may be provided in the first cell area CELL1, and a second through electrode THV2 may be provided in the second cell area CELL2. As shown in FIG. 18, the first through electrode THV1 may penetrate the common source line 320 and the word lines 330, however, this is an example, and the first through electrode THV1 may further penetrate the third substrate 310. The first through electrode THV1 may include a conductive material. According to an example embodiment, the first through electrode THV1 may include a conductive material surrounded by an insulating material. The second through electrode THV2 may have substantially the same shape and structure as those of the first through electrode THV1.

The first through electrode THV1 and the second through electrode THV2 may be electrically connected to each other through a first through metal pattern 372*d* and a second through metal pattern 472*d*. The first through metal pattern 372*d* may be formed at a lower end of the first-b chip Chip 1*b* including the first cell area CELL1, and the second through metal pattern 472*d* may be formed at an upper end of the first-a chip Chip 1*a* including the second cell area CELL2. The first through electrode THV1 may be electrically connected to the first metal line 350*c* and the second metal line 360*c*. A lower via 371*d* may be formed between the first through electrode THV1 and the first through metal pattern 372*d*, and an upper via 471*d* may be formed between the second through electrode THV2 and the second through metal pattern 472*d*. The first through metal pattern 372*d* may be connected to the second through metal pattern 472*d* by a bonding process.

In addition, in the bit line bonding area BLBA, an upper metal pattern 252 may be formed at a top metal layer of the second peripheral circuit area PERI2, and an upper metal pattern 392 having the same shape as the upper metal pattern 252 may be formed at a top metal layer of the first cell area CELL1. The upper metal pattern 392 of the first cell area CELL1 may be electrically connected to the upper metal pattern 252 of the second peripheral circuit area PERI2 by a bonding process.

Similarly, in the bit line bonding area BLBA, an upper metal pattern may be formed at a top metal layer of the second peripheral circuit area PERI2, and an upper metal pattern having the same shape as the upper metal pattern may be formed at a top metal layer of the first peripheral circuit area PERI1. The upper metal pattern of the second peripheral circuit area PERI2 may be electrically connected to the upper metal pattern of the first peripheral circuit area PERI1 by a bonding process.

In the bit line bonding area BLBA, the bit line 360*c* may be electrically connected to a page buffer included in the first and/or second peripheral circuit areas PERI1 and/or PERI2. As an example, some of the circuit elements 220*c* of the second peripheral circuit area PERI2 may provide a high-voltage page buffer PB_HV, and some of the circuit elements 120*c* of the first peripheral circuit area PERI1 may provide a low-voltage page buffer PB_LV. The bit line 360*c* may be electrically connected to the circuit elements 220*c* and 120*c* providing the page buffer through an upper bonding metal 370*c* of the first cell area CELL1 and an upper bonding metal 270*c* of the second peripheral circuit area PERI2.

Referring to FIG. 18, in the word line bonding area WLBA, the word lines 330 of the first cell area CELL1 may extend in the second horizontal direction (the X-axis direction) substantially parallel to the upper surface of the third substrate 310 and may be connected to a plurality of cell contact plugs 341 to 347 (340). A first metal line 350*b* and a second metal line 360*b* may be sequentially connected to an upper portion of the cell contact plugs 340 connected to the word lines 330. In the word line bonding area WLBA, the cell contact plugs 340 may be connected to the second peripheral circuit area PERI2 through an upper bonding metal 370*b* of the first cell area CELL1 and an upper bonding metal 270*b* of the second peripheral circuit area PERI2.

The cell contact plugs 340 may be electrically connected to a row decoder included in the first and/or second peripheral circuit areas PERI1 and/or PERI2. As an example, some of the circuit elements 220*b* of the second peripheral circuit area PERI2 may provide a pass transistor PT, and the cell contact plugs 340 may be electrically connected to the circuit elements 220*b* providing the pass transistor PT through the upper bonding metal 370*b* of the first cell area CELL1 and the upper bonding metal 270*b* of the second peripheral circuit area PERI2.

Similarly, in the word line bonding area WLBA, the word lines 430 of the second cell area CELL2 may extend in the second horizontal direction (the X-axis direction) substantially parallel to the upper surface of the fourth substrate 410 and may be connected to a plurality of cell contact plugs 441 to 447 (440). The cell contact plugs 440 may be connected to the second peripheral circuit area PERI2 through the upper metal pattern of the second cell area CELL2, the lower metal pattern and the upper metal pattern of the first cell area CELL1, and the cell contact plug 348.

In the word line bonding area WLBA, the upper bonding metal 370*b* may be formed in the first cell area CELL1, and the upper bonding metal 270*b* may be formed in the second peripheral circuit area PERI2. The upper bonding metal 370*b* of the first cell area CELL1 may be electrically connected to the upper bonding metal 270*b* of the second peripheral circuit area PERI2 by a bonding process. The upper bonding metal 370*b* and the upper bonding metal 270*b* may include aluminum, copper, or tungsten.

In the external pad bonding area PA, a lower metal pattern 371*e* may be formed at a lower portion of the first cell area CELL1, and an upper metal pattern 472*a* may be formed at an upper portion of the second cell area CELL2. The lower metal pattern 371*e* of the first cell area CELL1 and the upper metal pattern 472*a* of the second cell area CELL2 may be connected to each other by a bonding process in the external pad bonding area PA. Similarly, an upper metal pattern 372*a* may be formed at an upper portion of the first cell area CELL1, and an upper metal pattern 272*a* may be formed at the upper portion of the second peripheral circuit area PERI2. The upper metal pattern 372*a* of the first cell area CELL1 and the upper metal pattern 272*a* of the second peripheral circuit area PERI2 may be connected to each other by a bonding process.

Common source line contact plugs 380 and 480 may be disposed in the external pad bonding area PA. The common source line contact plugs 380 and 480 may be formed of a conductive material, such as a metal, a metal compound, or doped polysilicon. The common source line contact plug 380 of the first cell area CELL1 may be electrically connected to the common source line 320, and the common source line contact plug 480 of the second cell area CELL2 may be electrically connected to the common source line 420. A first metal line 350*a* and a second metal line 360*a* may be sequentially stacked on the common source line contact plug 380 of the first cell area CELL1, and a first metal line 450*a* and a second metal line 460*a* may be sequentially stacked on the common source line contact plug 480 of the second cell area CELL2.

Input/output pads 105, 405, and 406 may be disposed in the external pad bonding area PA. Referring to FIG. 18, a lower insulating layer 101 may cover a lower surface of the first substrate 110, and a first input/output pad 105 may be formed on the lower insulating layer 101. The first input/output pad 105 may be connected to at least one of the circuit elements 120*a* disposed in the first peripheral circuit area PERI1 through a first input/output contact plug 103 and may be separated from the first substrate 110 by the lower insulating layer 101. In addition, a side surface insulating layer may be disposed between the first input/output contact plug 103 and the first substrate 110. For example, the side-surface insulating layer may surround the input/output contact plug 103 between the input/output contact plug 103 and the substrate 110. Thus, the first input/output contact plug 103 and the first substrate 110 may be electrically separated from each other.

An upper insulating layer 401 may be formed on the fourth substrate 410 to cover the upper surface of the fourth substrate 410. A second input/output pad 405 and/or a third input/output pad 406 may be disposed on the upper insulating layer 401. The second input/output pad 405 may be connected to at least one of the circuit elements 220*a* disposed in the second peripheral circuit area PERI2 through second input/output contact plugs 403 and 303, and the third input/output pad 406 may be connected to at least one of the circuit elements 220*a* disposed in the second peripheral circuit area PERI2 through third input/output contact plugs 404 and 304.

According to an example embodiment, the fourth substrate 410 may not be disposed in an area in which the input/output contact plug is disposed. As shown in an area B, the third input/output contact plug 404 may be separated from the fourth substrate 410 in a direction substantially parallel to the upper surface of the fourth substrate 410 and may be connected to the third input/output pad 406 after penetrating an interlayer insulation layer 415 of the second cell area CELL2. In this case, the third input/output contact plug 404 may be formed through various processes.

According to an example embodiment, as shown in an area B1, a third input/output contact plug 404 may extend in the vertical direction (the Z-axis direction) and may have a diameter that increases as a distance from an upper insulating layer 401 decreases. That is, different from a diameter of a channel structure CH of the area A1 that decreases as a distance from the upper insulating layer 401 decreases, the diameter of the third input/output contact plug 404 may increase as the distance from the upper insulating layer 401 decreases. As an example, the third input/output contact plug 404 may be formed after a second cell area CELL2 is bonded to a first cell area CELL1 by the bonding process.

According to an example embodiment, as shown in an area B2, a third input/output contact plug 404 may extend in the vertical direction (the Z-axis direction) and may have a diameter that decreases as a distance from an upper insulating layer 401 decreases. That is, similar to the channel structure CH, the diameter of the third input/output contact plug 404 may decrease as the distance from the upper insulating layer 401 decreases. As an example, the third input/output contact plug 404 may be formed together with the cell contact plugs 440 before a second cell area CELL2 is bonded to a first cell area CELL1.

According to an example embodiment, an input/output contact plug may be disposed to overlap a fourth substrate 410. For instance, as shown in an area C, a second input/output contact plug 403 may be formed to penetrate an interlayer insulating layer 415 of a second cell area CELL2 in the vertical direction (the Z-axis direction) and may be electrically connected to a second input/output pad 405 through a fourth substrate 410. In this case, the second input/output contact plug 403 and the second input/output pad 405 may be connected to each other in various ways.

According to an example embodiment, as shown in an area C1, an opening 408 may be defined through a fourth substrate 410, and a second input/output contact plug 403 may be directly connected to a second input/output pad 405 via an opening 408 defined through the fourth substrate 410. In this case, as shown in the area C1, the second input/output contact plug 403 may have a diameter that increases as a distance from the second input/output pad 405 decreases. However, this is an example, and the diameter of the second input/output contact plug 403 may decrease as the distance from the second input/output pad 405 decreases.

According to an example embodiment, as shown in an area C2, an opening 408 may be defined through a fourth substrate 410, and a contact 407 may be formed in the opening 408. One end of the contact 407 may be connected to a second input/output pad 405, and the other end of the contact 407 may be connected to a second input/output contact plug 403. Accordingly, the second input/output contact plug 403 may be electrically connected to the second input/output pad 405 through the contact 407 in the opening 408. In this case, the contact 407 may have a diameter increasing as a distance from the second input/output pad 405 decreases, and the second input/output contact plug 403 may have a diameter decreasing as the distance from the second input/output pad 405 decreases as shown in the area C2. As an example, the third input/output contact plug 403 may be formed together with a cell contact plugs 440 before a second cell area CELL2 is bonded to a first cell area CELL1, and the contact 407 may be formed after the second cell area CELL2 is bonded to the first cell area CELL1.

In addition, according to an example embodiment, as shown in an area C3, a stopper 409 may be further formed at an upper surface of the opening 408 of the fourth substrate 410 when compared to the area C2. The stopper 409 may be a metal line disposed on the same layer as a common source line 420, however, this is an example. According to an example embodiment, the stopper 409 may be a metal line disposed on the same layer as at least one of word lines 430. The second input/output contact plug 403 may be electrically connected to the second input/output pad 405 through the contact 407 and the stopper 409.

Similar to the second and third input/output contact plugs 403 and 404 of the second cell area CELL2, the second and third input/output contact plugs 303 and 304 of the first cell area CELL1 may have a diameter decreasing as a distance from the lower metal pattern 371*e* decreases or may have a diameter increasing as the distance from the lower metal pattern 371*e* decreases.

A slit 411 may be formed in the fourth substrate 410 according to example embodiments. As an example, the slit 411 may be formed at an arbitrary position in the external pad bonding area PA. As an example, as shown in an area D, when viewed in a plane, the slit 411 may be disposed between the second input/output pad 405 and the cell contact plugs 440. However, this is an example, and when viewed in the plane, the slit 411 may be formed to allow the second input/output pad 405 to be positioned between the slit 411 and the cell contact plugs 440.

According to an example embodiment, as shown in an area D1, a slit 411 may be formed through a fourth substrate 410. The slit 411 may prevent the fourth substrate 410 from being slightly cracked when an opening 408 is formed. However, this is an example, and the slit 411 may be formed at a depth of approximately 60 to 70% of a thickness of the fourth substrate 410.

According to an example embodiment, as shown in an area D2, a conductive material 412 may be formed in a slit 411. The conductive material 412 may be used, for example, to discharge a leakage current generated when a circuit elements of an external pad bonding area PA are driven to the outside. In this case, the conductive material 412 may be connected to an external ground line.

According to an example embodiment, as shown in an area D3, an insulating material 413 may be formed in a slit 411. The insulating material 413 may be formed, for example, to electrically separate a second input/output pad 405 and a second input/output contact plug 403 disposed in an external pad bonding area PA from a word line bonding area WLBA. As the insulating material 413 is formed in the slit 411, a voltage provided through the second input/output pad 405 may be prevented from affecting a metal layer disposed on a fourth substrate 410 in the word line bonding area WLBA.

The first, second, and third input/output pads 105, 405, and 406 may be selectively formed according to example embodiments. As an example, the memory device 1000F may include only the first input/output pad 105 disposed above the first substrate 201, may include only the second input/output pad 405 disposed above the fourth substrate 410, or may include only the third input/output pad 406 disposed on the upper insulating layer 401.

According to example embodiments, at least one of the third substrate 310 of the first cell area CELL1 and the fourth substrate 410 of the second cell area CELL2 may be used as a sacrificial substrate and may be completely or partially removed before or after the bonding process. After the substrate is removed, an additional layer may be provided. As an example, the third substrate 310 of the first cell area CELL1 may be removed before or after the second peripheral circuit area PERI2 is bonded to the first cell area CELL1, and an insulating layer covering an upper surface of the common source line 320 or a conductive layer connecting the common source line 320 may be formed. Similarly, the fourth substrate 410 of the second cell area CELL2 may be removed before or after the first cell area CELL1 is bonded to the second cell area CELL2, and the upper insulating layer 401 covering the upper surface of the common source line 420 or a conductive layer connecting the common source line 420 may be formed.

As described above, the memory device 1000F may have the C2C structure, and particularly, the lower chip constituting the peripheral circuit may include the first peripheral circuit area PERI1 and the second peripheral circuit area PERI2, which are sequentially stacked in the vertical direction (the Z-axis direction).

In this case, the first peripheral circuit area PERI1 may include the circuit elements 120*a*, 120*b*, and 120*c* disposed on the substrate 110, the second peripheral circuit area PERI2 may include the circuit elements 220*a*, 220*b*, and 220*c* disposed on the substrate 210, and some of the circuit elements 120*a*, 120*b*, and 120*c* may be electrically connected to some of the circuit elements 220*a*, 220*b*, and 220*c*. The circuit elements 120*a*, 120*b*, and 120*c* disposed on the first peripheral circuit area PERI1 may be implemented by the low-voltage transistor, and the circuit elements 220*a*, 220*b*, and 220*c* disposed on the second peripheral circuit area PERI2 may be implemented by the high-voltage transistor.

As described above, as the first and second peripheral circuit areas PERI1 and PERI2 are formed by stacking the two chips along the vertical direction (the Z-axis direction), the area required to form the peripheral circuit when viewed in the plane may be reduced.

In addition, as the circuit elements implemented by the high-voltage transistors are intensively arranged in the second peripheral circuit area PERI2, the high-voltage transistors may have sufficient width and length.

For the convenience of explanation, the page buffer is described as including both high-voltage and low-voltage transistors, the pass transistor is described as including a high-voltage transistor, and the voltage generator, the input/output circuit, and the control logic are described as including low-voltage transistors. However, this is an example, and example embodiments are not limited thereto or thereby. As an example, at least one of the voltage generator, the input/output circuit, and the control logic may be implemented to include a high-voltage transistor and a low-voltage transistor. That is, at least one of the voltage generator, the input/output circuit, and the control logic may be implemented by the first peripheral circuit unit of FIG. 1. In this case, the first peripheral circuit unit may be disposed like the page buffer described with reference to FIGS. 4 to 18. As an example, when the voltage generator is implemented by the first peripheral circuit unit, the high-voltage transistors of the voltage generator may be disposed in the second chip, and the low-voltage transistors of the voltage generator may be disposed in the third chip.

While aspects of example embodiments have been particularly shown and described, it will be understood that various changes in form and details may be made therein without departing from the spirit and scope of the following claims.

What is claimed is:

1. A memory device comprising:

a memory cell array implemented in a first chip; and a peripheral circuit implemented in a second chip and a third chip which overlaps the first chip when viewed in a plan view, wherein the peripheral circuit comprises:

a first peripheral circuit implemented in the second chip and the third chip;

a second peripheral circuit implemented in the second chip and comprising at least one high-voltage transistor; and a third peripheral circuit implemented in the third chip and comprising at least one low-voltage transistor, and wherein the first peripheral circuit comprises:

a first sub-peripheral circuit implemented in the second chip and comprising at least one high-voltage transistor; and a second sub-peripheral circuit implemented in the third chip and comprising at least one low-voltage transistor.

2. The memory device of claim 1, wherein the first sub-peripheral circuit overlaps the second sub-peripheral circuit when viewed in a plan view.

3. The memory device of claim 2, wherein the first sub-peripheral circuit comprises a first transistor, the second sub-peripheral circuit comprises a second transistor, and a length in a vertical direction of a gate insulating layer of the first transistor is greater than a length in the vertical direction of a gate insulating layer of the second transistor.

4. The memory device of claim 3, wherein the first transistor is a high-voltage page buffer transistor, and the second transistor is a low-voltage page buffer transistor.

5. The memory device of claim 1, wherein the second chip comprises:

a first substrate in which the second peripheral circuit is provided; and a first element isolation area extending into the first substrate, wherein the third chip comprises:

a second substrate in which the third peripheral circuit is provided; and a second element isolation area extending into the second substrate, and wherein a length in a vertical direction of the first element isolation area is greater than a length in the vertical direction of the second element isolation area.

6. The memory device of claim 1, wherein the first chip comprises a plurality of cell contact plugs connected to a plurality of word lines of the memory cell array, respectively, wherein the second peripheral circuit of the second chip comprises a plurality of pass transistors connected to the plurality of cell contact plugs, respectively, and wherein a word line bonding area of the first chip in which the plurality of cell contact plugs are arranged overlaps a pass transistor area of the second chip in which the plurality of pass transistors are arranged, when viewed in a plan view.

7. The memory device of claim 6, wherein the third peripheral circuit comprises a voltage generator, and the pass transistor area overlaps an area in which the voltage generator is provided when viewed in a plan view.

8. The memory device of claim 1, wherein the third peripheral circuit of the third chip further comprises an input/output circuit, and the input/output circuit comprises the at least one low-voltage transistor of the third peripheral circuit.

9. The memory device of claim 1, wherein the first chip and the second chip are bonded to each other, and wherein the second chip and the third chip are bonded to each other.

10. The memory device of claim 9, wherein an upper bonding metal provided on the second chip is bonded to a bonding metal of the first chip, and wherein a lower bonding metal provided under the second chip is bonded to a bonding metal of the third chip.

11. The memory device of claim 10, wherein the second chip comprises:

a substrate in which the second peripheral circuit is provided; and a through electrode extending into the substrate and electrically connecting the second peripheral circuit and the lower bonding metal.

12. The memory device of claim 1, wherein the first chip and the third chip are bonded to each other, and the third chip and the second chip are bonded to each other.

13. The memory device of claim 1, wherein the peripheral circuit further comprises a fourth peripheral circuit implemented in the second chip and comprising at least one low-voltage transistor.

14. A memory device comprising:

a first chip comprising a memory cell array;

a second chip bonded to the first chip and comprising at least one high-voltage transistor; and a third chip bonded to the second chip and comprising at least one low-voltage transistor, wherein the at least one high-voltage transistor provided in the second chip overlaps the at least one low-voltage transistor provided in the third chip when viewed in a plan view.

15. The memory device of claim 14, wherein the second chip comprises:

a first substrate in which the at least one high-voltage transistor is provided; and a first element isolation area extending into the first substrate, wherein the third chip comprises:

a second substrate in which the at least one low-voltage transistor is provided; and a second element isolation area extending into the second substrate, and wherein a length in a vertical direction of the first element isolation area is greater than a length in the vertical direction of the second element isolation area.

16. The memory device of claim 15, wherein the second chip further comprises a through electrode that extends into the first substrate and electrically connects the at least one high-voltage transistor of the second chip and the at least one low-voltage transistor of the third chip.

17. The memory device of claim 14, wherein a length in a vertical direction of a gate insulating layer of the at least one high-voltage transistor is greater than a length in the vertical direction of a gate insulating layer of the at least one low-voltage transistor.

18. The memory device of claim 14, wherein the second chip further comprises a plurality of pass transistors connected to a plurality of word lines of the memory cell array, and wherein the third chip further comprises a voltage generator configured to generate a voltage provided to the plurality of word lines.

19. The memory device of claim 18, wherein a pass transistor area of the second chip, in which the plurality of pass transistors are arranged, overlaps an area of the third chip in which the voltage generator is provided when viewed in a plan view.

20. A memory device comprising:

a first chip comprising a memory cell array;

a second chip comprising a plurality of high-voltage transistors and overlapping the first chip when viewed in a plan view; and a third chip comprising a plurality of low-voltage transistors and overlapping the second chip when viewed in a plan view, wherein the second chip comprises:

a plurality of pass transistors connected to word lines of the memory cell array; and a plurality of high-voltage page buffers connected to bit lines of the memory cell array, and wherein the third chip comprises:

a voltage generator configured to generate a voltage provided to the plurality of pass transistors; and a plurality of low-voltage page buffers corresponding to the plurality of high-voltage page buffers, respectively, and comprising a plurality of latches.

* * * * *